(12) United States Patent
Peng et al.

(10) Patent No.: US 11,048,848 B2
(45) Date of Patent: Jun. 29, 2021

(54) SEMICONDUCTOR DEVICE INCLUDING REGION HAVING BOTH CONTINUOUS REGIONS, AND METHOD AND SYSTEM FOR GENERATING LAYOUT DIAGRAM OF SAME

(71) Applicant: TAIWAN SEMICONDUCTOR MANUFACTURING COMPANY, LTD., Hsinchu (TW)

(72) Inventors: Shih-Wei Peng, Hsinchu (TW); Chun-Hung Liou, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1 day.

(21) Appl. No.: 16/506,501

(22) Filed: Jul. 9, 2019

(65) Prior Publication Data
US 2020/0019672 A1 Jan. 16, 2020

Related U.S. Application Data

(60) Provisional application No. 62/698,504, filed on Jul. 16, 2018.

(51) Int. Cl.
G06F 30/392 (2020.01)
G03F 1/70 (2012.01)
G03F 1/36 (2012.01)
G06F 30/398 (2020.01)
G06F 30/394 (2020.01)

(52) U.S. Cl.
CPC ............ G06F 30/392 (2020.01); G03F 1/36 (2013.01); G03F 1/70 (2013.01); G06F 30/394 (2020.01); G06F 30/398 (2020.01)

(58) Field of Classification Search
CPC .................................................. G06F 30/392
USPC ......................................................... 716/119
See application file for complete search history.

(56) References Cited

U.S. PATENT DOCUMENTS

| 7,260,442 | B2 | 8/2007 | Hwang et al. |
| 8,791,027 | B2 | 7/2014 | Kofuji et al. |
| 9,256,709 | B2 | 2/2016 | Yu et al. |
| 2010/0281446 | A1* | 11/2010 | Hou ................. G06F 30/39 716/113 |
| 2014/0040838 | A1 | 2/2014 | Liu et al. |
| 2015/0015335 | A1 | 1/2015 | Chen et al. |

(Continued)

Primary Examiner — Eric D Lee
(74) Attorney, Agent, or Firm — Hauptman Ham, LLP

(57) ABSTRACT

A method (of generating a layout diagram) includes: for a first cell which includes first and second active area patterns, a cell-boundary (CB) having first and second edge portions (EPs) substantially parallel to a vertical direction (VEPs), and first and second VEP-adjacent regions correspondingly adjacent the first and second VEPs: configuring the first VEP-adjacent region (VAR) to be a first active area (AA) continuous (AA-continuous) region in which the first active area pattern extends in a horizontal direction from an interior of the first cell to the first VEP; and configuring the second VAR to be a first AA-discontinuous region, the second active area pattern extending in the horizontal direction from the interior of the first cell towards the second VEP, and there being a first gap between a first end of the second active area pattern and the second VEP representing the first AA-discontinuous region.

20 Claims, 36 Drawing Sheets

(56) References Cited

U.S. PATENT DOCUMENTS

2015/0048424 A1\* 2/2015 Tien ................ H01L 27/11807
257/208
2015/0278429 A1 10/2015 Chang \* cited by examiner

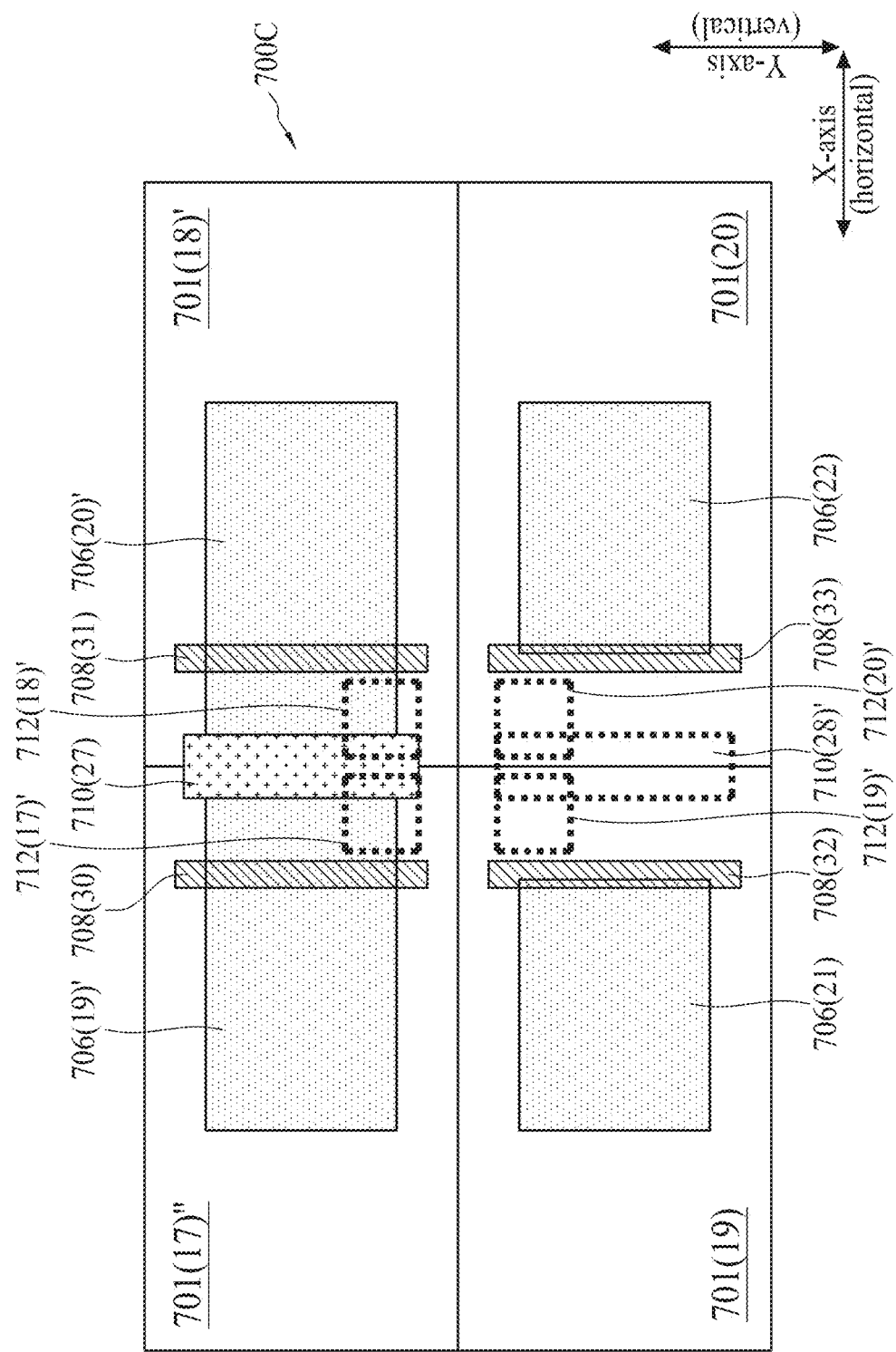

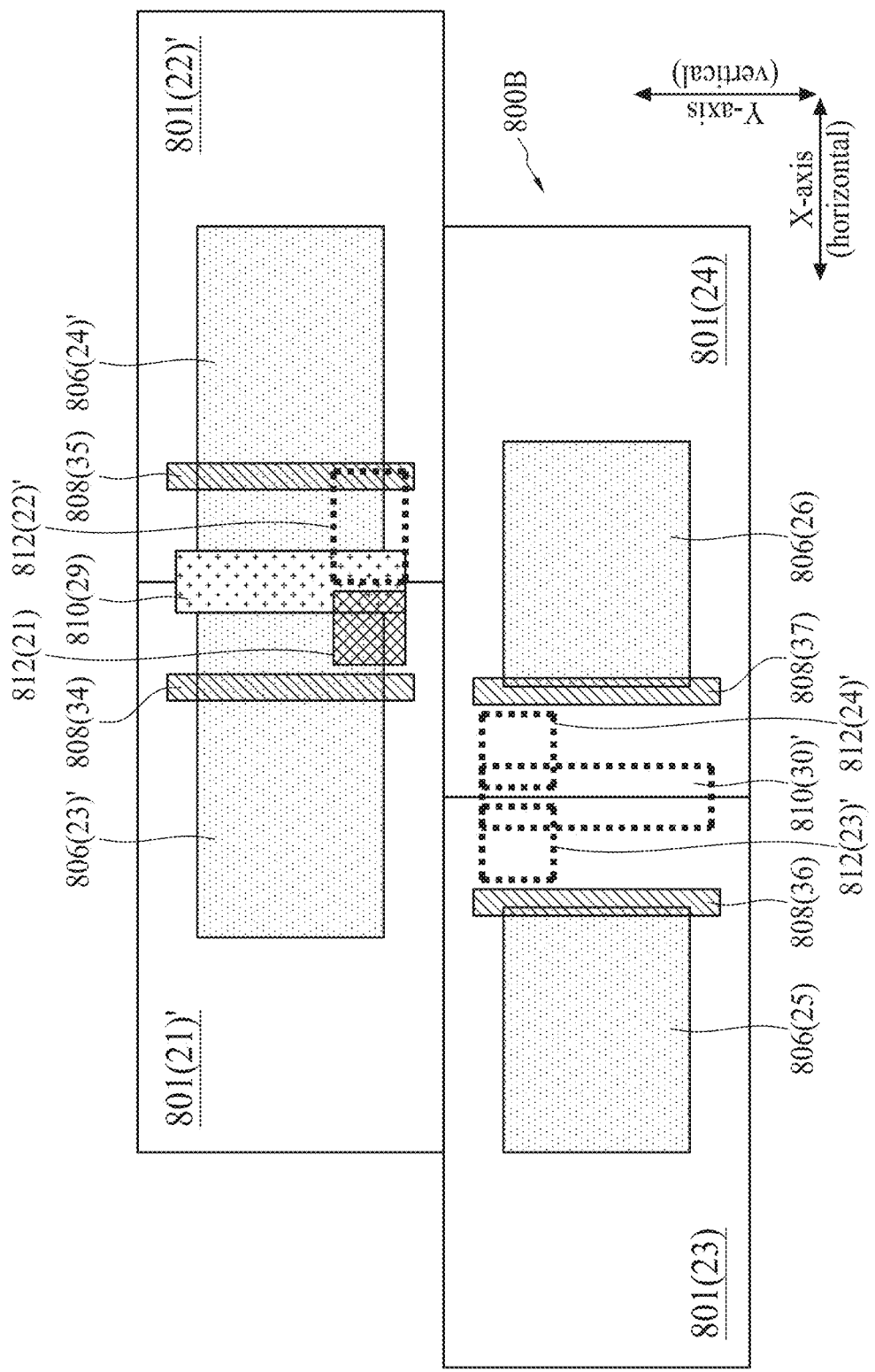

US 11,048,848 B2

SEMICONDUCTOR DEVICE INCLUDING REGION HAVING BOTH CONTINUOUS REGIONS, AND METHOD AND SYSTEM FOR GENERATING LAYOUT DIAGRAM OF SAME

PRIORITY CLAIM AND CROSS-REFERENCE

The present application claims the priority of U.S. Provisional Application No. 62/698,504, filed Jul. 16, 2018, which is incorporated herein by reference in its entirety.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process technology node by which will be fabricated a semiconductor device based on a layout diagram. The design rule set compensates for variability of the corresponding process technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7E are corresponding layout diagrams, in accordance with some embodiments.

FIGS. 8A-8L are corresponding layout diagrams, in accordance with some embodiments.

DETAILED DESCRIPTION

Figure 1:
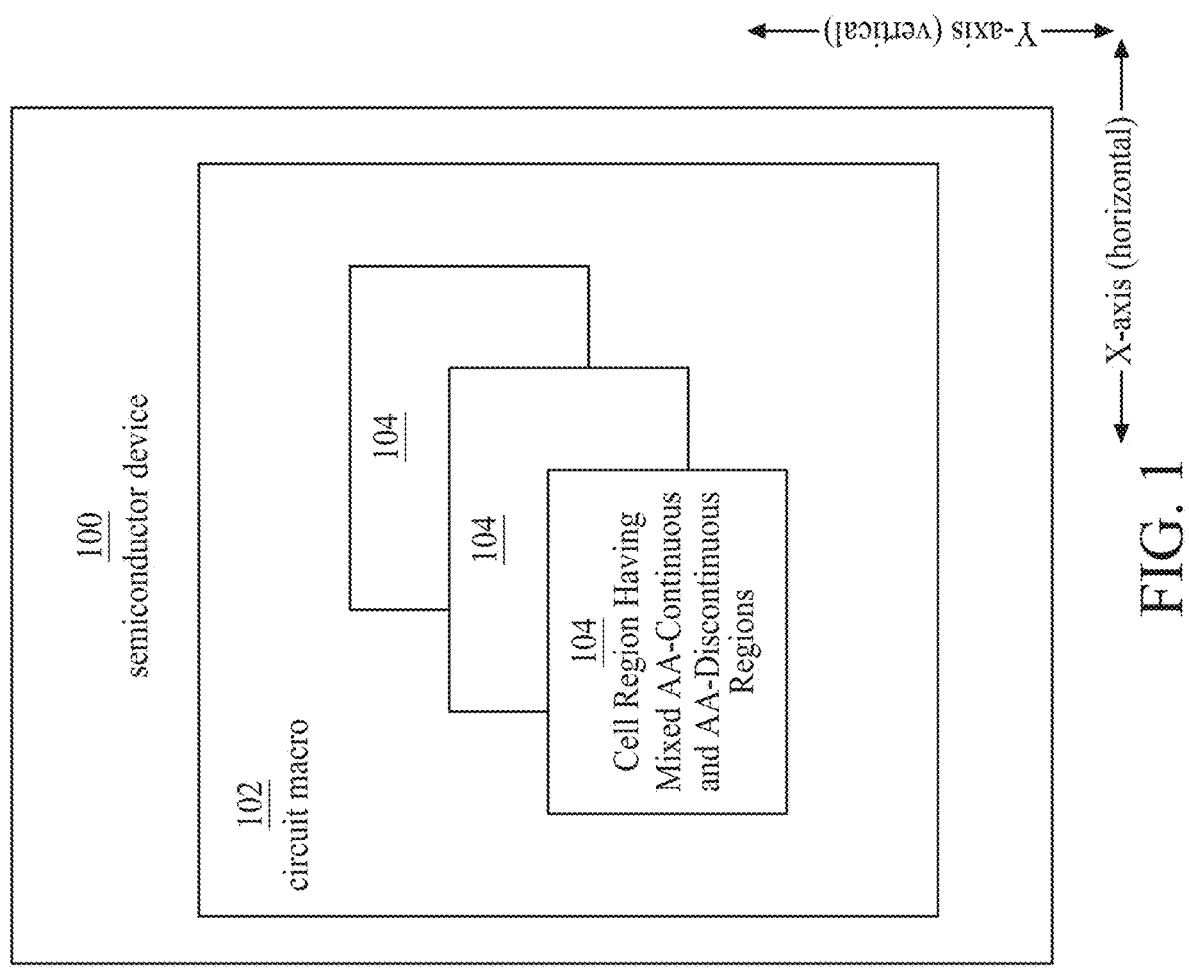
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a first cell region in a semiconductor device includes first and second active areas (AAs), wherein: one of the first active area or the second active area extends in a horizontal direction from an interior of the first cell region into an abutting second cell region (referred to herein as an AA-continuous configuration); and a first end of one of the first active area or the second active area extends in the horizontal direction from the interior of the first cell region towards an abutting third cell region, there being a first gap in the horizontal direction between the first end and a corresponding end of a corresponding active area in the third cell region (referred to herein as an AA-discontinuous configuration). In some embodiments, a cell region has a mix of at least one AA-continuous configuration and at least one AA-discontinuous configuration.

According to another approach (referred to herein as the all-AA-discontinuous approach), ends of all active areas of a first cell region extend in the horizontal direction from the interior of the first cell region towards abutting second and third cell regions on corresponding first and second sides of the first cell region, there being first and second gaps in the horizontal direction between first and second ends of the first active area and the corresponding second and third cell regions, and there being third and fourth gaps in the horizontal direction between first and second ends of the second active area and the corresponding second and third cell regions. A result of the all-AA-discontinuous approach is that, for each active area, no dummy transistor is formed in any of the first to fourth gaps, which reduces a tendency for leakage between cell regions but which increases a size of each cell region and thus the semiconductor device which includes such cell regions. According to another approach (referred to herein as the all-AA-continuous approach), all active areas of a first cell region extend in the horizontal direction into abutting second and third cell regions on corresponding first and second sides of the first cell region. A result of the all-AA-continuous approach is that, for each active area, there is a dummy transistor which represents a boundary between abutting cell regions, which reduces a size of the cell region as compared to the all-AA-discontinuous approach, but increases a tendency for leakage between cell regions.

According to some embodiments, a cell region having a mix of at least one AA-continuous configuration and at least one AA-discontinuous configuration has the benefit of the all-AA-continuous approach in at least one portion of the cell region and the benefit of the all-AA-discontinuous approach in at least one portion of the cell region. According to some embodiments, a first cell region having a mix of at least one AA-continuous configuration and at least one AA-discontinuous configuration has a benefit of being an active cell region which also provides a transition between a second cell region according to the all-AA-continuous approach and a third cell region according to the all-AA-discontinuous approach.

FIG. 1 is a block diagram of a semiconductor device 100 in accordance with at least one embodiment of the present disclosure.

In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more cell regions 104. Each cell region 104 has mixed AA-continuous and AA-discontinuous regions, as discussed below. Examples of layout diagrams resulting in cell region 104 include the layout diagrams disclosed herein.

Figure 2A:
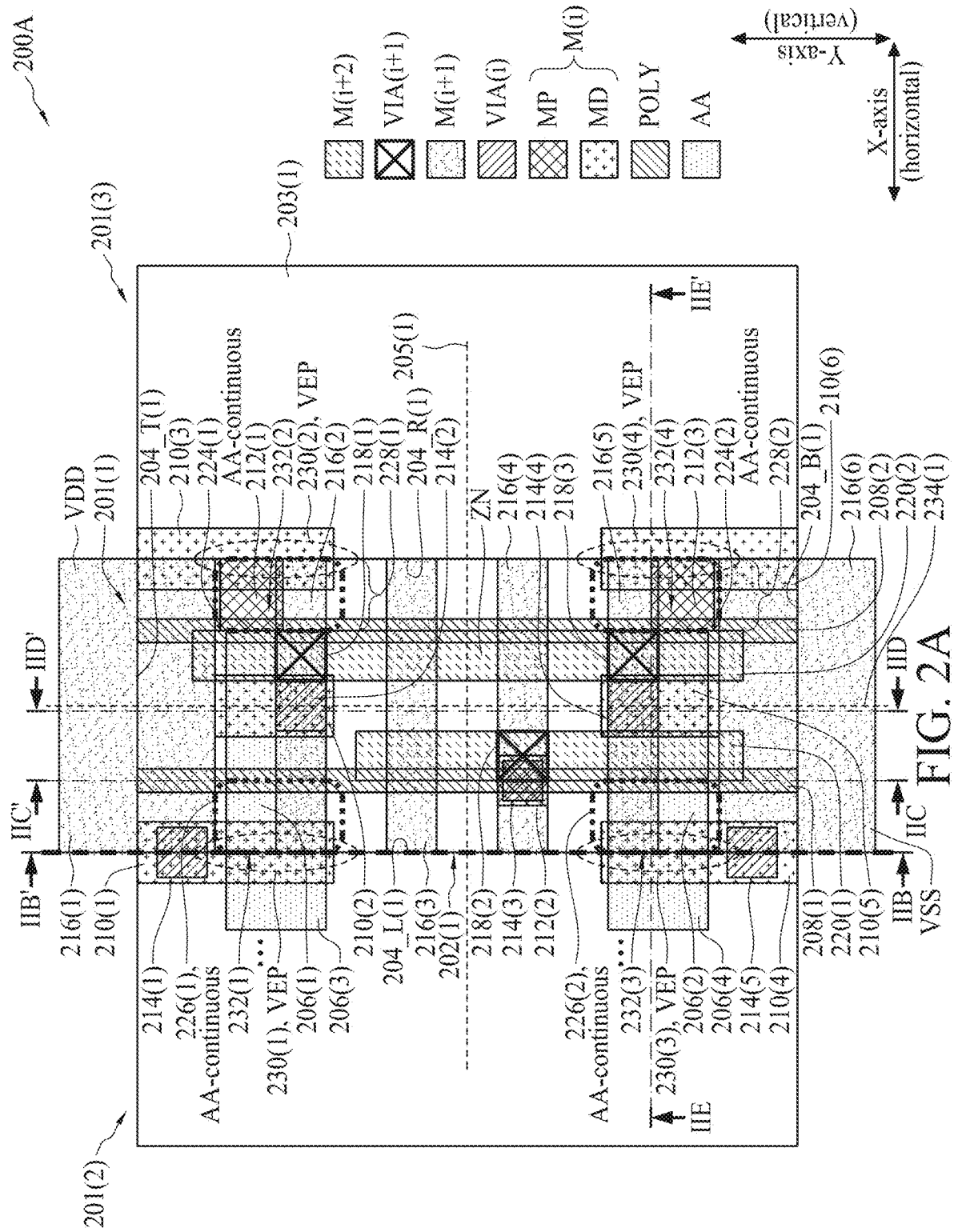
FIG. 2A is a layout diagram, in accordance with some embodiments.
Figure 2B:
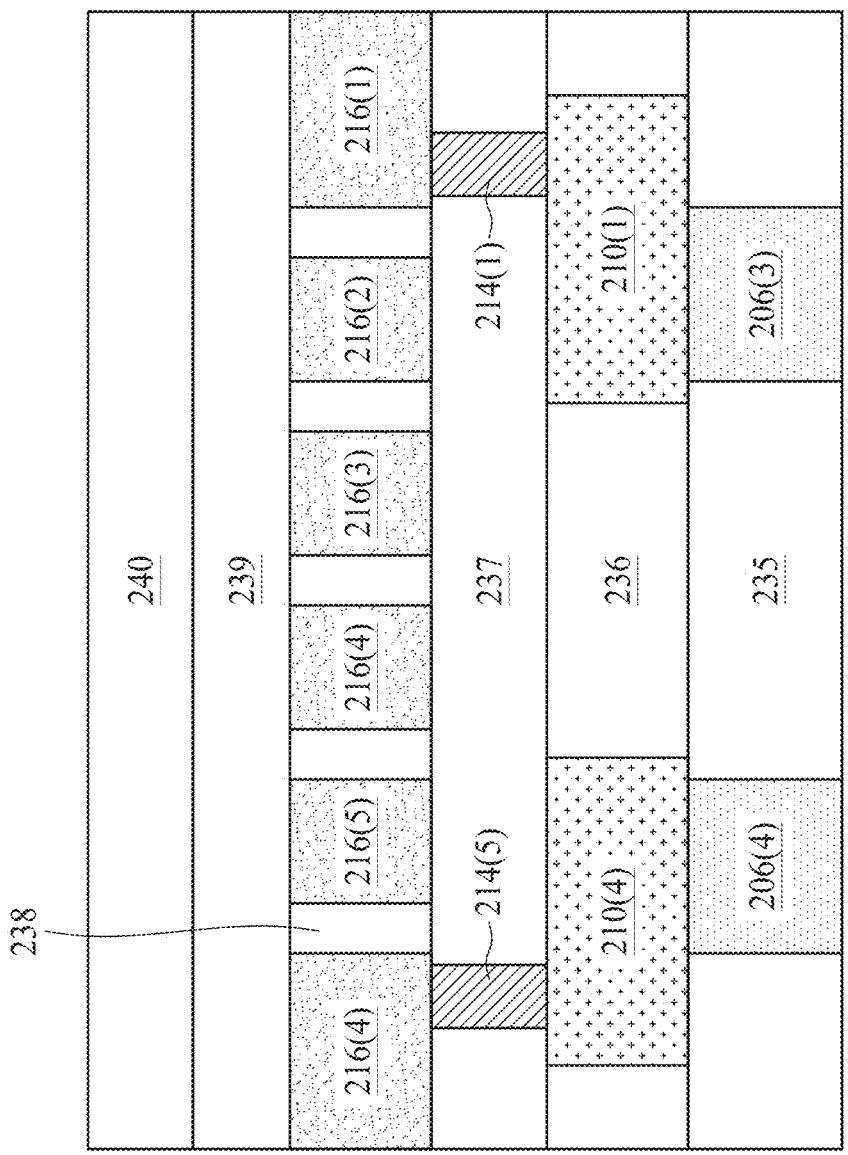
FIGS. 2B-2E are corresponding cross-sections, in accordance with at least some embodiments.
Figure 2C:
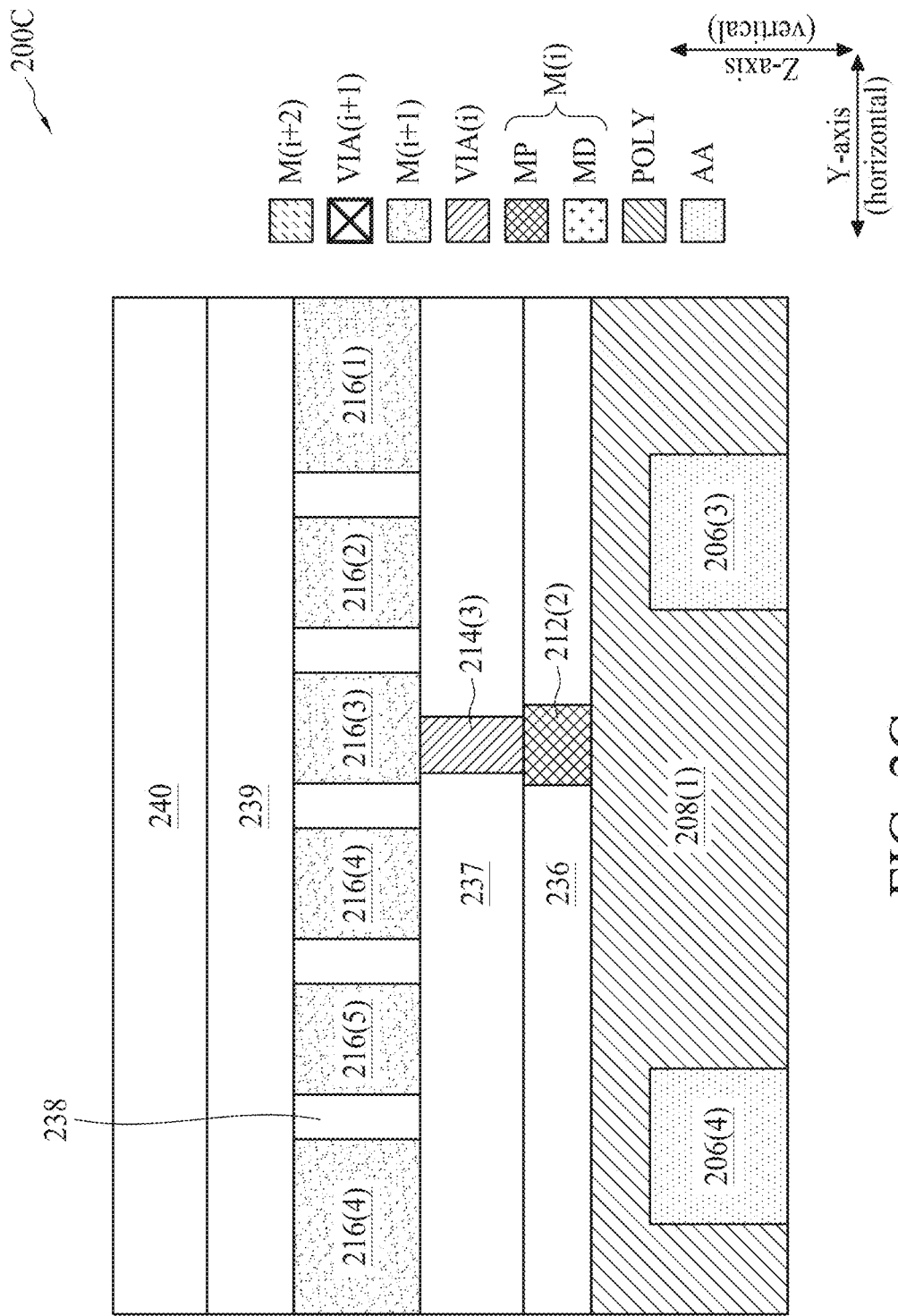
Figure 2D:
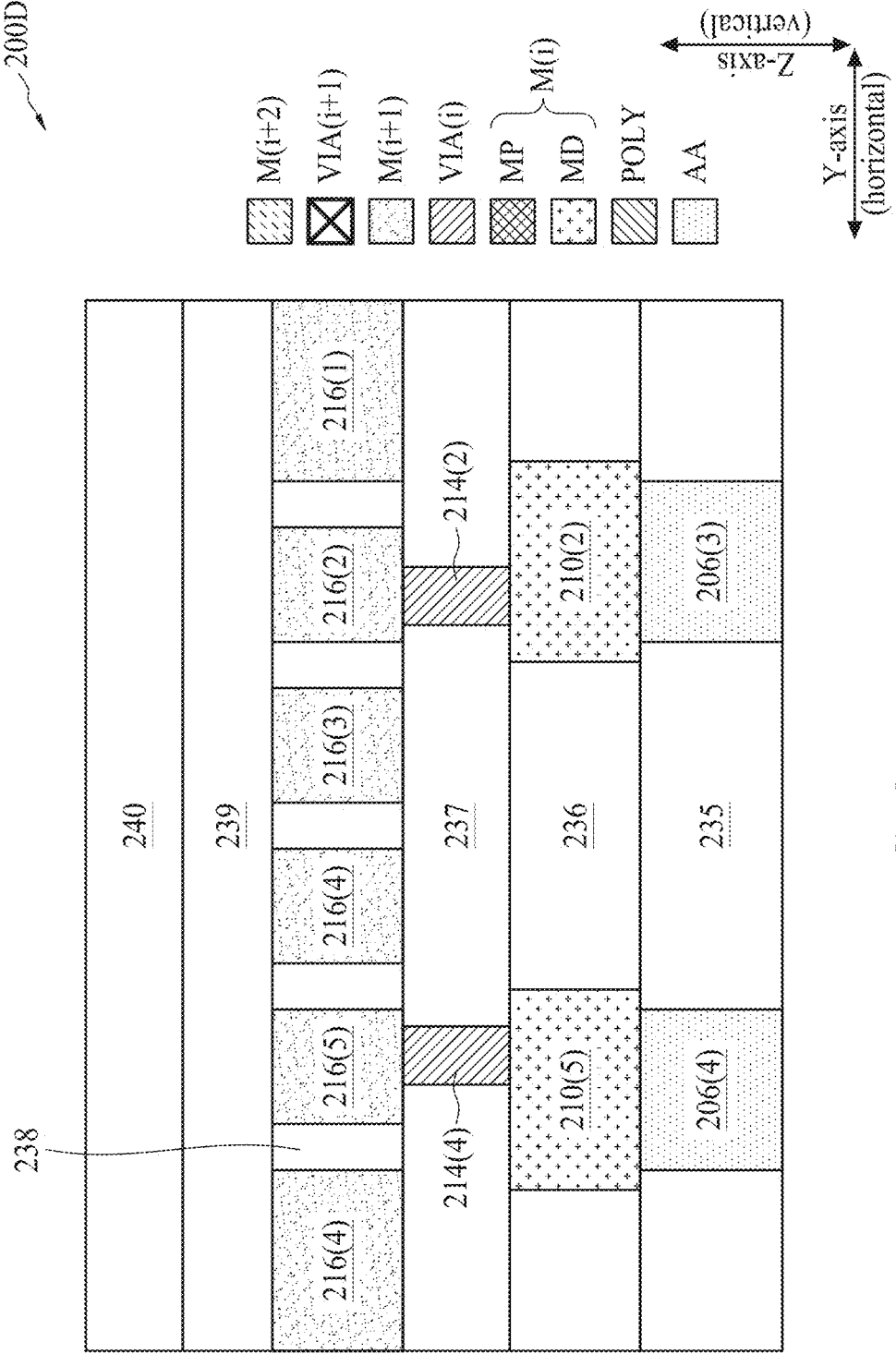
Figure 2E:
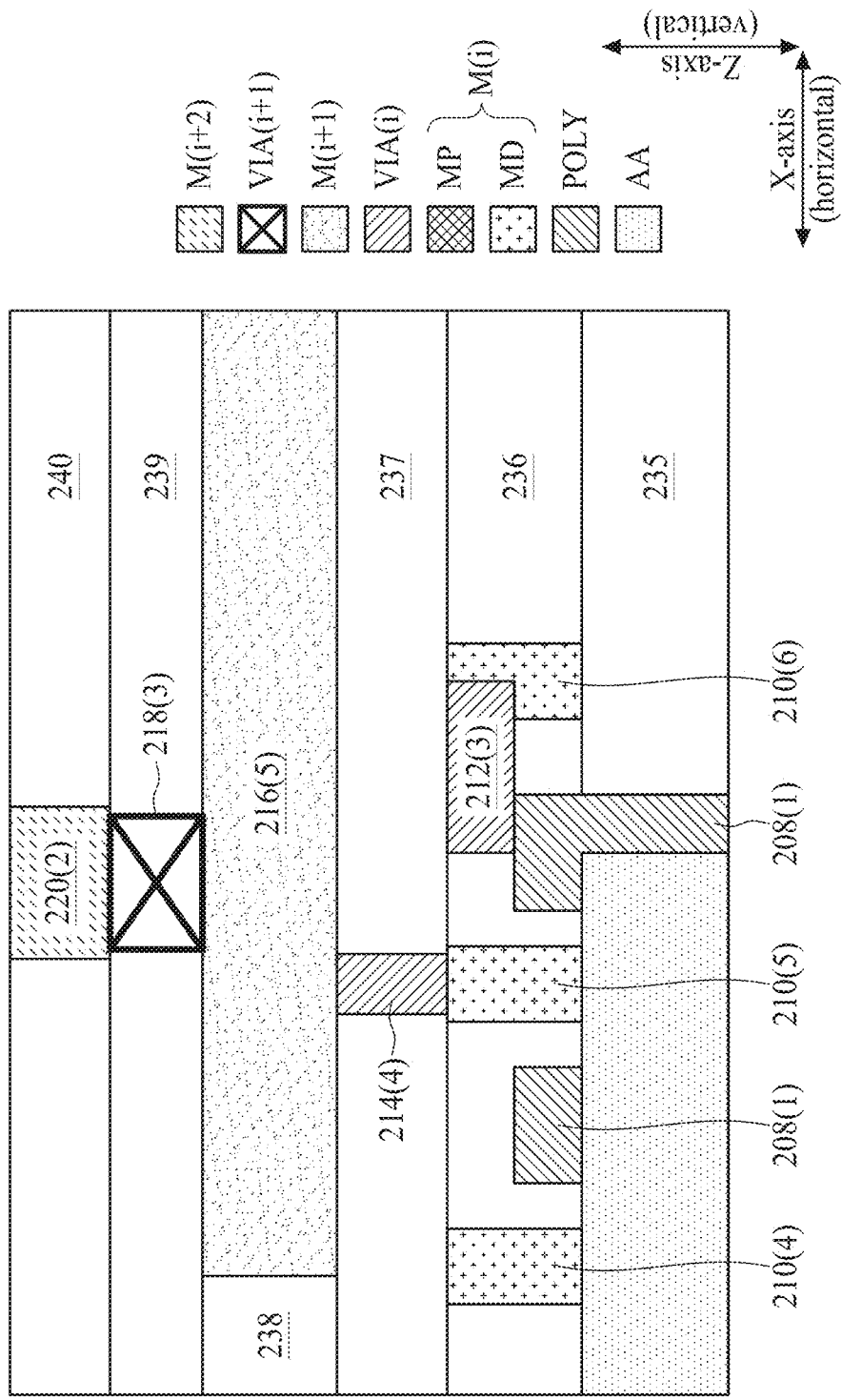

FIG. 2A is a layout diagram 200A for a corresponding semiconductor device, in accordance with at least one embodiment of the present disclosure.

Layout diagram 200A includes at least cells 201(1), 201(2) and 201(3). For simplicity of illustration, layout diagram 200A shows only cells 201(1), 201(2) and 201(3). Cells 201(1), 201(2) and 201(3) are shown in the same row of layout diagram 200A. In some embodiments, layout diagram 200A includes cells in addition to cells 201(1), 201(2) and 201(3). In some embodiments, layout diagram 200A includes cells other than cells 201(1), 201(2) and 201(3). In a first direction, cell 201(1) abuts corresponding cells 201(2) and 201(3). In FIG. 2A, the first direction is the horizontal direction. In some embodiments, the first direction is a direction other than the horizontal direction.

As discussed in more detail below, cell 201(1) is a cell having a mix of at least one AA-continuous configuration and at least one AA-discontinuous configuration. For purposes of providing context, as an example, it is assumed that cell 201(1) represents an inverter cell. In some embodiments, cell 201(1) represents a functional cell having a mix of at least one AA-continuous configuration and at least one AA-discontinuous configuration which represents a functional cell other than an inverter cell. An example of a cell region based on cell 201(1) of layout diagram 200A is cell region 104 included in semiconductor device 100 of FIG. 1.

Cell 201(1) has a cell-boundary (CB) 202(1) which includes a top side 204_T(1), a bottom side 204_B(1), a right side 204_R(1) and a left side 204_L(1). Cells 201(1), 201(2) and 201(3) are disposed on a substrate pattern 203(1). Each of cells 201(1), 201(2) and 201(3) includes a corresponding variety of patterns, as discussed below. For simplicity of discussion, the variety of patterns in cell 201(1) is discussed in detail below, whereas none of the patterns in cell 201(3) are shown or discussed, and only two of the patterns in cell 201(2) are shown and discussed.

Cell 201(1) includes active area (AA) patterns 206(1) and 206(2) on a substrate pattern 203(1). Long axes of AA patterns 206(1) and 206(2) extend in the first direction. Similarly, cell 201(2) includes AA patterns 206(3) and 206(4). AA pattern 206(1) is disposed above, and AA pattern 206(2) is disposed below, a horizontal midline 205(1). In some embodiments, AA patterns 206(1) and 206(2) are disposed symmetrically about horizontal midline 205(1). AA patterns 206(1)-206(4) represent corresponding active areas in a semiconductor device fabricated based on layout diagram 200A.

In some embodiments, AA pattern 206(1) is designated for PMOS configuration and AA pattern 206(2) is designated for NMOS configuration. In some embodiments, AA pattern 206(1) is designated for NMOS configuration and AA pattern 206(2) is designated for PMOS configuration. In some embodiments, AA patterns 206(1) and 206(2) are designated for finFET configuration.

Cell 201(1) further includes gate patterns 208(1) and 208(2), long axes of which extend substantially in a second direction, the second direction being substantially perpendicular to the first direction. Recalling that the first direction in FIG. 2A is the horizontal direction, accordingly the second direction is the vertical direction in FIG. 2A. In some embodiments, the second direction is a direction other than the vertical direction. Gate patterns 208(1) and 208(2) represent corresponding first and second gate conductors in a semiconductor device fabricated based on layout diagram 200A.

In some embodiments, gate patterns 208(1) and 208(2) are designated to be formed of polycrystalline silicon (polysilicon). In some embodiments, gate patterns 208(1) and 208(2) are designated to be formed of a silicide material. In some embodiments, gate patterns 208(1) and 208(2) are designated to be formed of a material other than polysilicon. In some embodiments, gate patterns 208(1) and 208(2) are designated to be formed of a metal composite, e.g., as WN, TiN, TaN, or the like.

A minimum distance in the horizontal direction between gate patterns 208(1) and 208(2) is specific to a process technology node by which will be fabricated a semiconductor device based on layout diagram 200A. In some embodiments, the minimum distance in the horizontal direction between gate patterns 208(1) and 208(2) is referred to as the poly pitch. In some embodiments, the distance in the horizontal direction between gate patterns 208(1) and 208(2) is a positive integer multiple of the poly pitch. In some embodiments, a width of cells 201(1), 201(2) and 201(3) is a corresponding positive integer multiple of the poly pitch. A width in the horizontal direction of gate patterns 208(1) and 208(2) is set by a design rule which corresponds to a process technology node by which will be fabricated a semiconductor device based on layout diagram 200A.

Cell 201(1) further includes contact patterns 210(1), 210(2), 210(3), 210(4), 210(5) and 210(6), long axes of which extend substantially in the second direction, which is the vertical direction in FIG. 2A. In some embodiments, contact patterns 210(1), 210(2), 210(3), 210(4), 210(5) and 210(6) are referred to as MD patterns. Contact patterns 210(1)-210(6) represent corresponding contacts in a semiconductor device fabricated based on layout diagram 200A, such contacts (and corresponding vias) being disposed between, and thereby electrically connecting, corresponding source/drain portions of active areas with corresponding conductors in a first layer of metallization $M\_1^{st}$.

In some embodiments, MD is an abbreviation of the term 'metallization over drain/source.' In some embodiments, patterns 210(1), 210(2), 210(3), 210(4), 210(5) and 210(6) are referred to as MOOD patterns. In some embodiments, MOOD is an abbreviation of the term 'metal zero over OD,' where OD itself is an abbreviation of the term 'oxide dimensioned,' with oxide dimensioned being another term for active area, and where the numbering convention of the corresponding design rules of the corresponding semiconductor process technology node begins with a first layer of metallization M being referred to as M(0). In some embodiments, patterns 210(1), 210(2), 210(3), 210(4), 210(5) and 210(6) are referred to as M1OD patterns. In some embodiments, M1OD is an abbreviation of the term 'metal one over OD,' where the numbering convention of the corresponding design rules of the corresponding semiconductor process technology node begins with a first layer of metallization M_1st being referred to as M(1). Contact patterns 210(1), 210(2), 210(3), 210(4), 210(5) and 210(6) hereinafter will be referred to as MD patterns 210(1), 210(2), 210(3), 210(4), 210(5) and 210(6). Hereinafter, the first layer of metallization $M\_1^{st}$ is referred to as M(i), where i=0 or i=1.

Cell 201(1) further includes contact patterns 212(1), 212(2) and 212(3), long axes of which extend substantially in the first direction, which is the horizontal direction in FIG. 2A. In some embodiments, contact patterns 212(1), 212(2) and 212(3) are referred to as MP patterns. Contact patterns 212(1)-212(3) represent corresponding contacts in a semiconductor device fabricated based on layout diagram 200A, such contacts (and corresponding vias) being disposed between and thereby electrically connecting corresponding gate conductors with corresponding conductors in the first layer of metallization $M\_1^{st}$.

In some embodiments, MP is an abbreviation of the term 'metallization over poly,' where poly refers to a gate conductor. In some embodiments, patterns 212(1), 212(2) and 212(3) are referred to as M0OP patterns. In some embodiments, M0OP is an abbreviation of the term 'metal zero over poly,' where the numbering convention of the corresponding design rules of the corresponding semiconductor process technology node begins with a first layer of metallization M_1st being referred to as M(0). In some embodiments, patterns 212(1), 212(2) and 212(3) are referred to as M1OP patterns. In some embodiments, M1OP is an abbreviation of the term 'metal one over poly,' where the numbering convention of the corresponding design rules of the corresponding semiconductor process technology node begins with a first layer of metallization M_1st being referred to as M(1). Contact patterns 212(1), 212(2) and 212(3) hereinafter will be referred to as MP patterns 212(1), 212(2) and 212(3).

Details regarding MD patterns, e.g., MD patterns 210(1)-210(6), and MP patterns, e.g., MP patterns 212(1)-212(3) are found, e.g., in U.S. Pre-Grant Publication No. 20150048424, published Feb. 19, 2015, U.S. Pre-Grant Publication No. 20150015335, published Jan. 15, 2015, and U.S. Pat. No. 8,791,024, granted Jul. 29, 2014, the entireties of each of which are hereby incorporated by reference.

Cell 201(1) further includes via patterns 214(1), 214(2), 214(3), 214(4) and 214(5) in a first interconnection layer VIA $P^r$. Via patterns 214(1)-214(5) represent corresponding vias in a semiconductor device fabricated based on layout diagram 200A, such vias (and corresponding contacts) being disposed between and thereby electrically connecting corresponding source/drain portions of active areas or gate conductors with corresponding conductors in the first layer of metallization $M\_1^{st}$.

In some embodiments, where the numbering convention of the corresponding design rules of the corresponding semiconductor process technology node begins with a first layer of metallization M_1st being referred to as M(0), the first interconnection layer VIA $P^r$ is referred to as VIA(0). In some embodiments, where the numbering convention of the corresponding design rules of the corresponding semiconductor process technology node begins with a first layer of metallization $M\_1^{st}$ being referred to as M(1), the first interconnection layer $VIA\_1^{st}$ is referred to as VIA(1). Hereinafter, the first interconnection layer $VIA\_1^{st}$ is referred to as VIA(i) in correspondence to the first layer of metallization M(i).

In some embodiments, via patterns 214(1)-214(5) are substantially square. In some embodiments, where via patterns 214(1)-214(5) are substantially square, a size in each of the horizontal and vertical directions of via patterns 214(1)-214(5) is approximately equal to a size in the vertical direction of a conductive routing pattern (discussed below) in a second layer of metallization $M\_2^{nd}$, where the size of the latter corresponds to one or more design rules of the corresponding semiconductor a process technology node by which will be fabricated a semiconductor device based on layout diagram 200A.

Cell 201(1) further includes conductor patterns 216(1), 216(2), 216(3), 216(4), 216(5) and 216(6), long axes of which extend in the first direction, which is the horizontal direction in FIG. 2A. Conductor patterns 216(1)-206(6) represent corresponding conductors in the second layer of metallization $M\_2^{nd}$ of a semiconductor device fabricated based on layout diagram 200A. Hereinafter, the second layer of metallization $M\_2^{nd}$ is referred to as M(i+1).

For purposes furthering the example in which cell 201(1) is assumed to represent an inverter cell, it is further assumed that: conductor patterns 216(1) and 216(6) are power grid (PG) patterns that represent corresponding conductors in a power grid of a semiconductor device which is fabricated based on layout diagram 200A; and conductor patterns 216(2)-216(5) are routing patterns that represent non-PG conductors of a semiconductor device which is fabricated based on layout diagram 200A. In some embodiments, PG pattern 216(1) is designated for providing a first system reference voltage and PG pattern 216(2) is designated for providing a second system reference voltage. In FIG. 2A, PG pattern 216(1) is designated for providing VDD and PG pattern 216(2) is designated for providing VSS. In some embodiments, PG pattern 216(1) is designated for providing VSS and PG pattern 216(2) is designated for providing VDD.

Sizes in the vertical direction of PG patterns 216(1) and 216(6) correspond to one or more design rules of the corresponding semiconductor a process technology node by which will be fabricated a semiconductor device based on layout diagram 200A. Similarly, sizes in the vertical direction of PG patterns 216(2)-216(5) correspond to one or more design rules of the corresponding semiconductor a process technology node by which will be fabricated a semiconductor device based on layout diagram 200A.

Cell 201(1) further includes via patterns 218(1), 218(2) and 218(3) in a second interconnection layer $VIA\_2^{nt}$. Via patterns 218(1)-218(3) represent corresponding vias in a semiconductor device fabricated based on layout diagram 200A, such vias (and corresponding contacts) being disposed between and thereby electrically connecting corresponding source/drain portions of conductor patterns in the second layer of metallization M(i+1) and corresponding conductor patterns in a third layer of metallization M_3$^{rd}$ (discussed below).

In some embodiments, where the numbering convention of the corresponding design rules of the corresponding semiconductor process technology node begins with a first layer of metallization M_1st being referred to as M(0), the second interconnection layer VIA_2$^{nd}$ is referred to as VIA(1). In some embodiments, where the numbering convention of the corresponding design rules of the corresponding semiconductor process technology node begins with a first layer of metallization M_1$^{st}$ being referred to as M(1), the second interconnection layer VIA_2$^{nd}$ is referred to as VIA(2). Hereinafter, the second interconnection layer VIA_2$^{nd}$ is referred to as VIA(i+1) in correspondence to the first layer of metallization M(i+1).

In some embodiments, via patterns 218(1)-218(3) are substantially square. In some embodiments, where via patterns 218(1)-218(3) are substantially square, a size in each of the horizontal and vertical directions of via patterns 218(1)-218(3) is approximately equal to a size in the vertical direction of a conductive routing pattern (discussed below) in the third layer of metallization M_3$^{rd}$ (discussed below), where the size of the latter corresponds to one or more design rules of the corresponding semiconductor a process technology node by which will be fabricated a semiconductor device based on layout diagram 200A.

Cell 201(1) further includes conductor patterns 220(1) and 220(2), long axes of which extend in the second direction, which is the vertical direction in FIG. 2A. Conductor patterns 220(1) and 220(2) represent corresponding conductors in the third layer of metallization M_3$^{rd}$ of a semiconductor device fabricated based on layout diagram 200A. Hereinafter, the third layer of metallization M_3$^{rd}$ is referred to as M(i+2).

For purposes furthering the example in which cell 201(1) is assumed to represent an inverter cell, it is further assumed that: conductor patterns 220(1) and 220(2) are routing patterns that represent corresponding input and output pins of an inverter region of a semiconductor device which is fabricated based on layout diagram 200A. Sizes in the horizontal direction of routing patterns 220(1) and 220(2) correspond to one or more design rules of the corresponding semiconductor a process technology node by which will be fabricated a semiconductor device based on layout diagram 200A.

For purposes furthering the example in which cell 201(1) is assumed to represent an inverter cell, gate pattern 208(1) represents the first gate conductor which connects to a gate terminal of each of a PMOS transistor and an NMOS transistor of a semiconductor device which is fabricated based on layout diagram 200A.

Gate pattern 208(1) is overlapped by MP pattern 212(2), MP pattern 212(2) is overlapped by via pattern 214(3), via pattern 214(3) is overlapped by routing pattern 216(4) of the second metallization layer M(i+1), routing pattern 216(4) is overlapped by via pattern 218(2), and via pattern 218(2) is overlapped by routing pattern 220(1) of the third metallization layer M(i+2), which represents a first stack of corresponding conductive structures of the inverter which is fabricated based on layout diagram 200A. The first stack connects an input pin (I) of the inverter to the gate terminal of each of a PMOS transistor and an NMOS transistor in the inverter.

The PMOS transistor of the inverter which is fabricated based on layout diagram 200A corresponds to AA pattern 206(1). The NMOS transistor of the inverter which is fabricated based on layout diagram 200A corresponds to AA pattern 206(2).

Regarding the PMOS transistor, MD pattern 210(1) overlaps a source portion of AA pattern 206(1). MD pattern 210(2) is located on an opposite side of MD pattern 210(1) relative to gate pattern 208(1). MD pattern 210(2) overlaps a drain portion of AA pattern 206(1). MD pattern 210(1) is overlapped by via pattern 214(1), and via pattern 214(1) is overlapped by PG pattern 216(1) which (again) is designated for VDD in FIG. 2A, which represents a second stack of corresponding conductive structures of the inverter which is fabricated based on layout diagram 200A. The second stack connects a source portion of the active area of the PMOS transistor to a PG conductor which provides VDD. MD pattern 210(1) also overlaps a source portion of AA pattern 206(3).

Also regarding the PMOS transistor of the inverter which is fabricated based on layout diagram 200A, MD pattern 210(2) is overlapped by via pattern 214(2), via pattern 214(2) is overlapped by routing pattern 216(2) of the second metallization layer M(i+1), routing pattern 216(2) is overlapped by via pattern 218(1), and via pattern 218(1) is overlapped by routing pattern 220(2) of the third metallization layer M(i+2), which represents a third stack of corresponding conductive structures of the inverter which is fabricated based on layout diagram 200A. The third stack connects a drain portion of the active area of the PMOS transistor to an output pin of the inverter.

Regarding the NMOS transistor, MD pattern 210(4) overlaps a source portion of AA pattern 206(1). MD pattern 210(5) is located on an opposite side of MD pattern 210(4) relative to gate pattern 208(1). MD pattern 210(5) overlaps a drain portion of AA pattern 206(2). MD pattern 210(4) is overlapped by via pattern 214(5), and via pattern 214(5) is overlapped by PG pattern 216(2) which (again) is designated for VSS in FIG. 2A, which represents a fourth stack of corresponding conductive structures of the inverter which is fabricated based on layout diagram 200A. The fourth stack connects a source portion of the active area of the NMOS transistor to a PG conductor which provides VSS. MD pattern 210(4) also overlaps a source portion of AA pattern 206(4).

Also regarding the NMOS transistor of the inverter which is fabricated based on layout diagram 200A, MD pattern 210(5) is overlapped by via pattern 214(4), via pattern 214(4) is overlapped by routing pattern 216(5) of the second metallization layer M(i+1), routing pattern 216(5) is overlapped by via pattern 218(3), and via pattern 218(3) is overlapped by routing pattern 220(2) of the third metallization layer M(i+2), which represents a fifth stack of corresponding structures of the inverter which is fabricated based on layout diagram 200A. The fifth stack connects a drain portion of the active area of the NMOS transistor to the output pin of the inverter.

In layout diagram 200A of FIG. 2A, AA pattern 206(1) extends from an interior of cell 201(1) and has an end 232(1) which aligns with left side 204_L(1) of cell 201(1). AA pattern 206(3) extends from an interior of cell 201(2) to the right side of cell 201(2), which aligns with left side 204_L(1) of cell 201(1). AA pattern 206(2) extends from the interior of cell 201(1) and has an end 232(3) which aligns with left side 204_L(1) of cell 201(1). AA pattern 206(4) extends from an interior of cell 201(2) to the right side of cell 201(2), which aligns with left side 204_L(1) of cell 201(1).

Again cell 201(1) is a cell having a mix of at least one AA-continuous configuration and at least one AA-discontinuous configuration. In particular, cell 201(1) has AA-continuous regions 226(1) and 226(2), and AA-discontinuous regions 224(1) and 224(2), as discussed below.

With respect to a vertical midline 234(1) of cell 201(1), AA pattern 206(1) is asymmetric because AA-continuous region 226(1) is located at end 232(1) of AA pattern 206(1) and AA-discontinuous region 224(1) is located at end 232(2) of AA pattern 206(1). With respect to vertical midline 234(1) of cell 201(1), AA pattern 206(2) is asymmetric because AA-continuous region 226(2) is located at end 232(3) of AA pattern 206(2) and AA-discontinuous region 224(2) is located at end 232(2) of AA pattern 206(1). Accordingly, with respect to vertical midline 234(1), cell 201(1) is asymmetric in terms of AA pattern continuity/discontinuity.

With respect to horizontal midline 205(1) of cell 201(1), left side 204_L(1) is symmetric because AA-continuous region 226(1) is located at end 232(1) of AA pattern 206(1) and AA-continuous region 226(2) is located at end 232(3) of AA pattern 206(2). With respect to horizontal midline 205(1) of cell 201(1), right side 204_R(1) is symmetric because AA-discontinuous region 224(1) is located at end 232(2) of AA pattern 206(1) and AA-discontinuous region 224(2) is located at end 232(4) of AA pattern 206(2). Accordingly, with respect to horizontal midline 205(1), cell 201(1) is symmetric in terms of AA pattern continuity/discontinuity.

An edge portion (EP) of CB 202(1) where AA patterns 206(1) and 206(3) meet left side 204_L(1) of cell 201(1) is a vertical EP (VEP) 230(1). A VEP 230(3) is located where AA patterns 206(2) and 206(4) meet left side 204_L(1) of cell 201(1).

A region 226(1) adjacent VEP 230(1) is referred to as VEP-adjacent region 226(1). AA pattern 206(1) is continuous with respect to left side 204_L(1) because end 232(1) of AA pattern 206(1) extends to left side 204_L(1). Accordingly, VEP-adjacent region 226(1) is described herein as being configured as an AA-continuous region 226(1). A region 226(2) adjacent VEP 230(3) is referred to as VEP-adjacent region 226(2). AA pattern 206(2) is continuous with respect to left side 204_L(1) because end 232(3) of AA pattern 206(2) extends to left side 204_L(1). Accordingly, VEP-adjacent region 226(3) is described herein as being configured as an AA-continuous region 226(3).

In layout diagram 200A of FIG. 2A, AA pattern 206(1) extends from an interior of cell 201(1) towards right side 204_R(1) of cell 201(1). However, an end 232(2) of AA pattern 206(1) substantially aligns with a long axis of gate pattern 208(2), resulting in a gap 228(1) in the horizontal direction between end 232(2) of AA pattern 206(1) and right side 204_R(1) of cell 201(1). Similarly, there is a gap (not shown) in cell 201(3) between the left side of cell 201(3) (which aligns with right side 204_R(1) of cell 201(1)) and a left edge of an active pattern (not shown) in cell 201(3) which is substantially collinear with AA pattern 206(1).

A VEP 230(2) is located on right side 204_R(1) where AA pattern 206(1) would meet right side 204_R(1) if end 232(2) of AA pattern 206(1) extended to right side 204_R(1) of cell 201(1) rather than gap 228(1) being therebetween. A VEP 230(4) is located on right side 204_R(1) where AA pattern 206(2) would meet right side 204_R(1) if end 232(4) of AA pattern 206(2) extended to right side 204_R(1) of cell 201(1) rather than gap 228(2) being therebetween.

A region 224(1) corresponding to gap 228(1) which is adjacent to right side 204_R(1) of cell 201(1) is referred to as VEP-adjacent region 224(1). AA pattern 206(1) is discontinuous with respect to right side 204_R(1) because gap 228(1) is between end 232(2) of AA pattern 206(1) and right side 204_R(1). Accordingly, VEP-adjacent region 224(1) is described herein as being configured as an AA-discontinuous region 224(1). A region 224(2) corresponding to gap 228(2) which is adjacent to right side 204_R(1) of cell 201(1) is referred to as VEP-adjacent region 224(2). AA pattern 206(2) is discontinuous with respect to right side 204_R(1) because gap 228(2) is between end 232(4) of AA pattern 206(2) and right side 204_R(1). Accordingly, VEP-adjacent region 224(2) is described herein as being configured as an AA-discontinuous region 224(2).

In the vicinity of AA-discontinuous region 224(1), MD pattern 210(3) overlaps a border portion of AA-discontinuous region 224(1). MD pattern 210(3) also overlaps a border portion (not shown) of an AA-discontinuous region (not shown) in cell 201(3) which is substantially collinear with AA-discontinuous region 224(1). MD pattern 210(3) is located on an opposite side of MD pattern 210(2) relative to gate pattern 208(2). MD pattern 210(3) does not overlap AA pattern 206(1); rather, MD pattern 210(3) overlaps substrate pattern 203(1). In some embodiments, MD pattern 210(3) represents a body/substrate contact in a semiconductor device based on layout diagram 200A. MD pattern 210(3) is overlapped by MP pattern 212(1), and MP 212(1) is overlapped by gate pattern 208(2), which represents a sixth stack of corresponding conductive structures of the inverter which is fabricated based on layout diagram 200A. The sixth stack connects a corresponding MD contact to the second gate conductor. In some embodiments, the arrangement of MD pattern 210(3), MP pattern 212(1) and gate pattern 208(2) is referred to as a 'body-MP-tie' arrangement.

In the vicinity of AA-discontinuous region 224(2), MD pattern 210(6) overlaps a border portion of AA-discontinuous region 224(2). MD pattern 210(6) also overlaps a border portion (not shown) of an AA-discontinuous region (not shown) in cell 201(3) which is substantially collinear with AA-discontinuous region 224(2). MD pattern 210(6) is located on an opposite side of MD pattern 210(5) relative to gate pattern 208(2). MD pattern 210(6) does not overlap AA pattern 206(2); rather, MD pattern 210(6) overlaps substrate pattern 203(1). In some embodiments, MD pattern 210(6) represents a body/substrate contact in a semiconductor device based on layout diagram 200A. MD pattern 210(6) is overlapped by MP pattern 212(2), and MP 212(2) is overlapped by gate pattern 208(2), which represents a seventh stack of corresponding conductive structures of the inverter which is fabricated based on layout diagram 200A. The seventh stack connects a corresponding MD contact to the second gate conductor. In some embodiments, the arrangement of MD pattern 210(6), MP pattern 212(3) and gate pattern 208(2) is an example of a body-MP-tie arrangement.

In some embodiments, regarding AA-discontinuous regions 224(1) and 224(2), corresponding MD patterns 210(3) and 210(6), corresponding MP patterns 212(1) and 212(3), and gate pattern 208(2) are designated to be left floating. In some embodiments, MP patterns 212(1) and 212(3) are omitted.

FIGS. 2B-2E are corresponding cross-sections 200B-200E, in accordance with at least some embodiments.

Cross-sections 200B-200E represent structures in a semiconductor device based on layout diagram 200A of FIG. 2A. Accordingly, and for simplicity, the numbering of FIG. 2A is used in FIGS. 2B-2E albeit with the understanding that the numbering refers to patterns in FIG. 2A and to corresponding structures in FIGS. 2B-2E. Cross-sections 200B-200E each further include interlayer dielectric layers (ILDs) 235, 236, 237, 238, 239 and 240.

Figure 3:
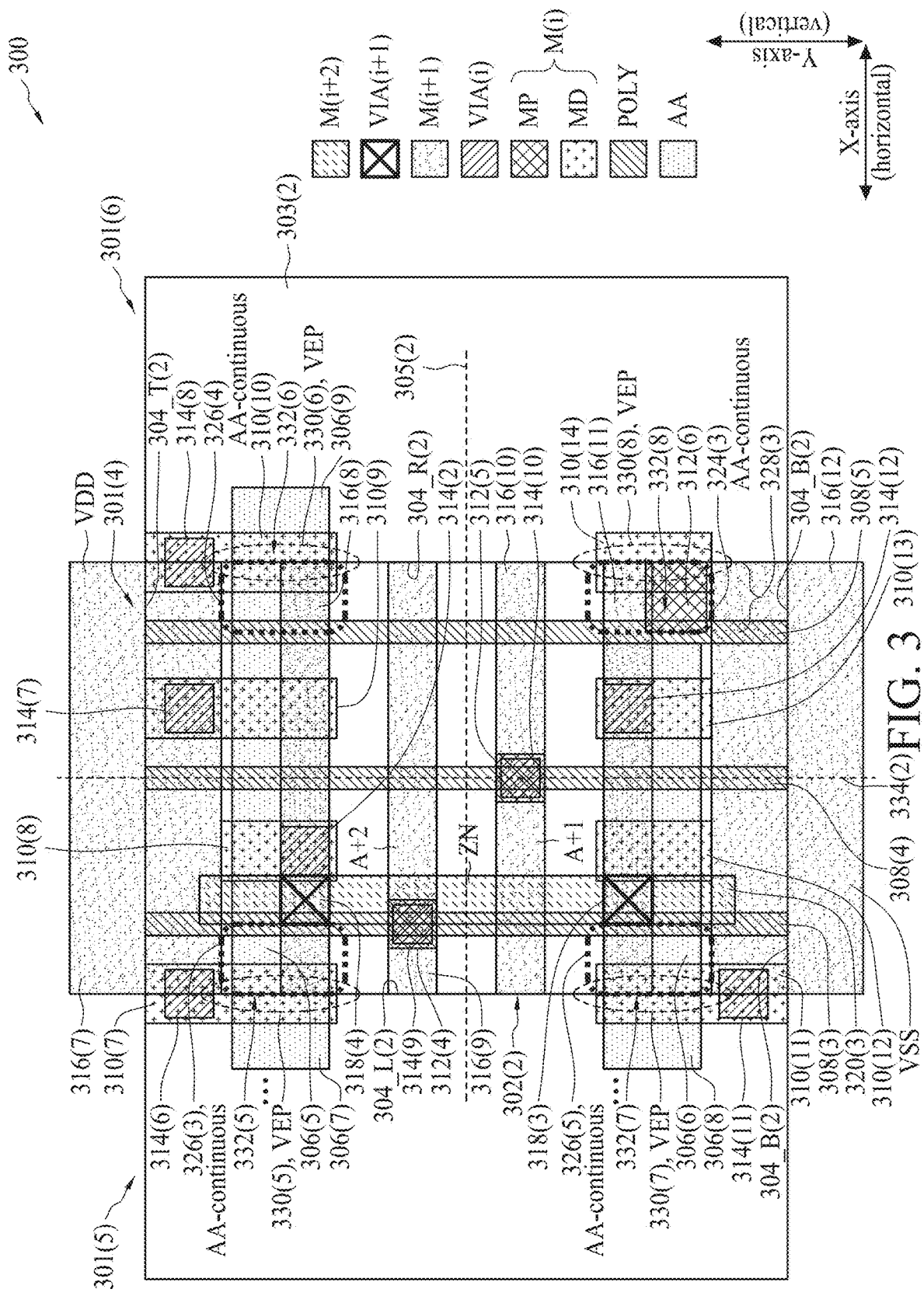
FIG. 3 is a layout diagram, in accordance with some embodiments.

FIG. 3 is a layout diagram 300 for a corresponding semiconductor device, in accordance with at least one embodiment of the present disclosure.

Layout diagram 300 is similar to layout diagram 200A. For brevity, the discussion will focus more on differences between layout diagram 300 and layout diagram 200A than on similarities. Elements of layout diagram 300 which are similar to elements of layout diagram 200A have 3-series numbers which track corresponding 2-series numbers in layout diagram 200A, e.g., cell 301(4) is similar to cell 201(1), where the parenthetical 4 in 301(4) and the parenthetical 1 in 206(1) indicate that cell 301(4) nevertheless is different than cell 201(1). As another example, substrate pattern 303(2) is similar to substrate pattern 203(1), where the parenthetical 2 in 303(2) and the parenthetical 1 in 203(1) indicate that substrate pattern 303(2) is not necessarily the same as substrate pattern 203(1). As another example, AA pattern 306(5) is similar to AA pattern 206(1), where the parenthetical 5 in 306(5) and the parenthetical 1 in 206(1) indicate that AA pattern 306(5) nevertheless is different than AA pattern 206(1).

Cell 301(4) is a cell having a mix of at least one AA-continuous configuration and at least one AA-discontinuous configuration. For purposes of providing context, as an example, it is assumed that cell 301(4) represents an AND cell. In some embodiments, cell 301(4) represents a functional cell having a mix of at least one AA-continuous configuration and at least one AA-discontinuous configuration which represents a functional cell other than an AND cell. An example of a cell region based on cell 301(4) of layout diagram 300 is cell region 104 included in semiconductor device 100 of FIG. 1.

Again cell 301(4) is a cell having a mix of at least one AA-continuous configuration and at least one AA-discontinuous configuration. In particular, cell 301(4) has AA-continuous regions 326(3), 326(4) and 326(5), and AA-discontinuous region 324(3).

With respect to a vertical midline 334(2) of cell 301(4), AA pattern 306(5) is symmetric because AA-continuous region 326(3) is located at end 332(5) of AA pattern 306(5) and AA-continuous region 326(4) is located at end 332(6) of AA pattern 306(5). With respect to vertical midline 334(2) of cell 301(4), AA pattern 306(6) is asymmetric because AA-continuous region 326(5) is located at end 332(7) of AA pattern 306(6) and AA-discontinuous region 324(3) is located at end 332(8) of AA pattern 306(6). Accordingly, with respect to vertical midline 334(2), cell 301(4) is asymmetric in terms of AA pattern continuity/discontinuity.

With respect to horizontal midline 305(2) of cell 301(4), left side 304_L(2) is symmetric because AA-continuous region 326(3) is located at end 332(5) of AA pattern 306(5) and AA-continuous region 326(5) is located at end 332(7) of AA pattern 306(6). With respect to horizontal midline 305(2) of cell 301(4), right side 304_R(2) is asymmetric because AA-continuous region 326(4) is located at end 332(6) of AA pattern 306(5) and AA-discontinuous region 324(3) is located at end 332(8) of AA pattern 306(6). Accordingly, with respect to horizontal midline 205(1), cell 301(4) is asymmetric in terms of AA pattern continuity/discontinuity.

FIGS. 4A-4E are corresponding layout diagrams 400A-400E for corresponding semiconductor devices, in accordance with at least one embodiment of the present disclosure.

Layout diagrams 400A-400E correspondingly are similar to layout diagrams 200A and 300. For brevity, the discussion will focus more on differences between layout diagrams 400A-400E and corresponding layout diagrams 200A and/or 300 than on similarities. Elements of layout diagrams 400A-400E which are similar to corresponding elements of layout diagrams 200A and/or 300 have 4-series numbers which track corresponding 2-series and/or 3-series numbers in corresponding layout diagrams 200A and/or 300, e.g., cell 401(7) is similar to cells 201(1) and 301(4), where the parenthetical 7 in 401(7) and the parentheticals (1) in 206(1) and (3) in 301(4) indicate that cells 401(7), 201(1) and 301(4) nevertheless are different from each other. As another example, AA pattern 406(9) in layout diagram 400A is similar to AA patterns 206(2) in layout diagram 200A and 306(6) in layout diagram 300, where the parenthetical 9 in 406(9), the parenthetical 2 in 206(2) and the parenthetical 6 in 306(6) indicate that AA pattern 406(9) nevertheless is different than AA patterns 206(2) and 306(6). As another example, MP pattern 412(7) in layout diagram 400A is similar to MP patterns 212(3) in layout diagram 200A and 312(6) in layout diagram 300, where the parenthetical 7 in 412(7), the parenthetical 3 in 212(3) and the parenthetical 6 in 312(6) indicate that MP pattern 412(7) nevertheless is different than MP patterns 212(3) and 312(6). For simplicity of illustration, layout diagrams 400A-400E correspondingly are simplified in some respects to corresponding layout diagrams 200A and/or 300; accordingly some elements in layout diagrams 400A-400E which correspond to elements in layout diagrams 200A and/or 300 nevertheless are not shown in layout diagrams 400A-400E.

Figure 4A:
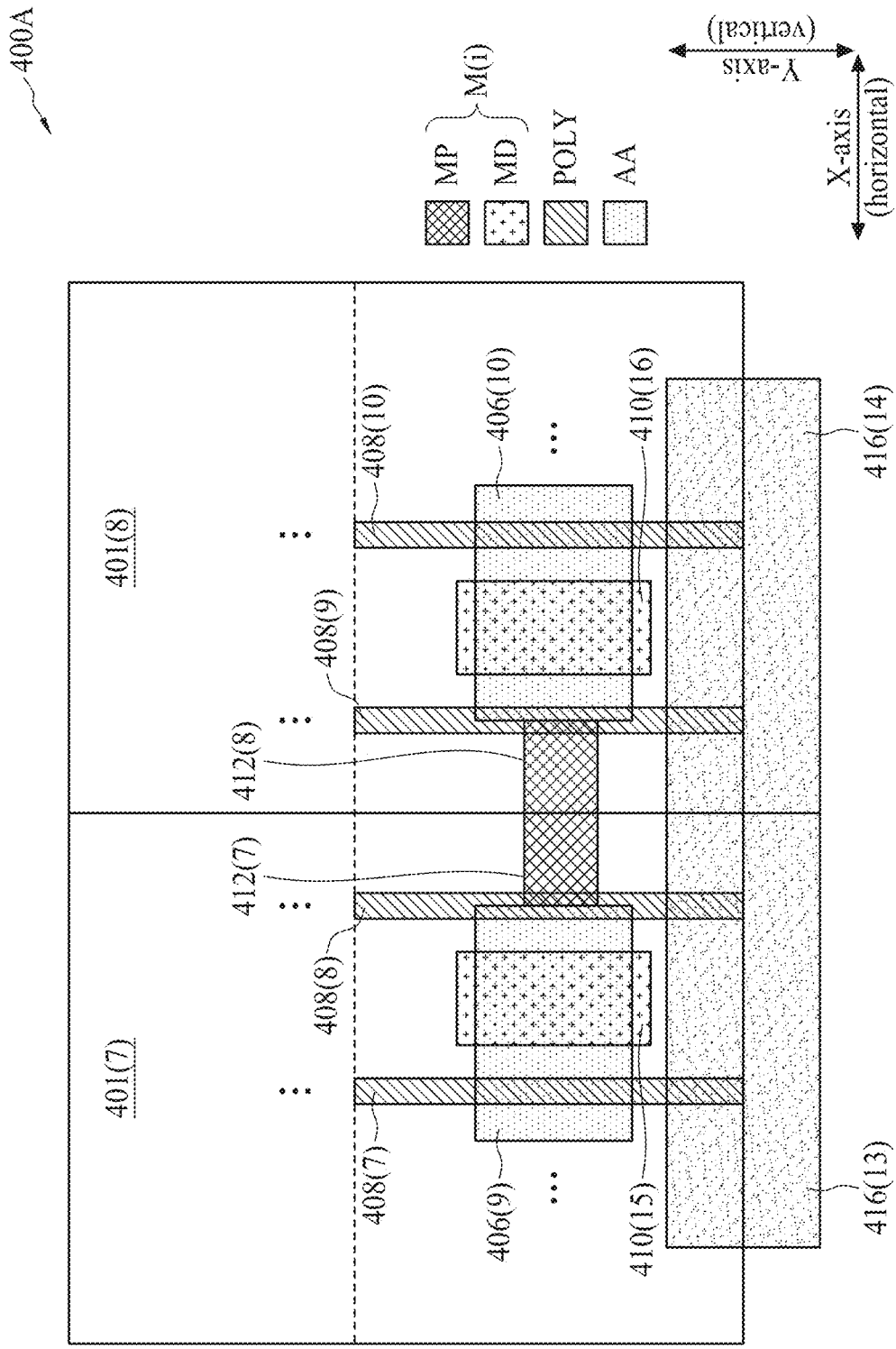
FIGS. 4A-4E are corresponding layout diagrams, in accordance with some embodiments.

As another example in the context of FIG. 4A, MP pattern 412(7) in layout diagram 400A is similar to MP patterns 212(3) in layout diagram 200A and 312(6) in layout diagram 300, where the parenthetical 7 in 412(7), the parenthetical 3 in 212(3) and the parenthetical 6 in 312(6) indicate that MP pattern 412(7) nevertheless is different than MP patterns 212(3) and 312(6).

In FIG. 4A, MP patterns 412(7) and 412(8) abut in the horizontal direction in layout diagram 400A.

Figure 4B:
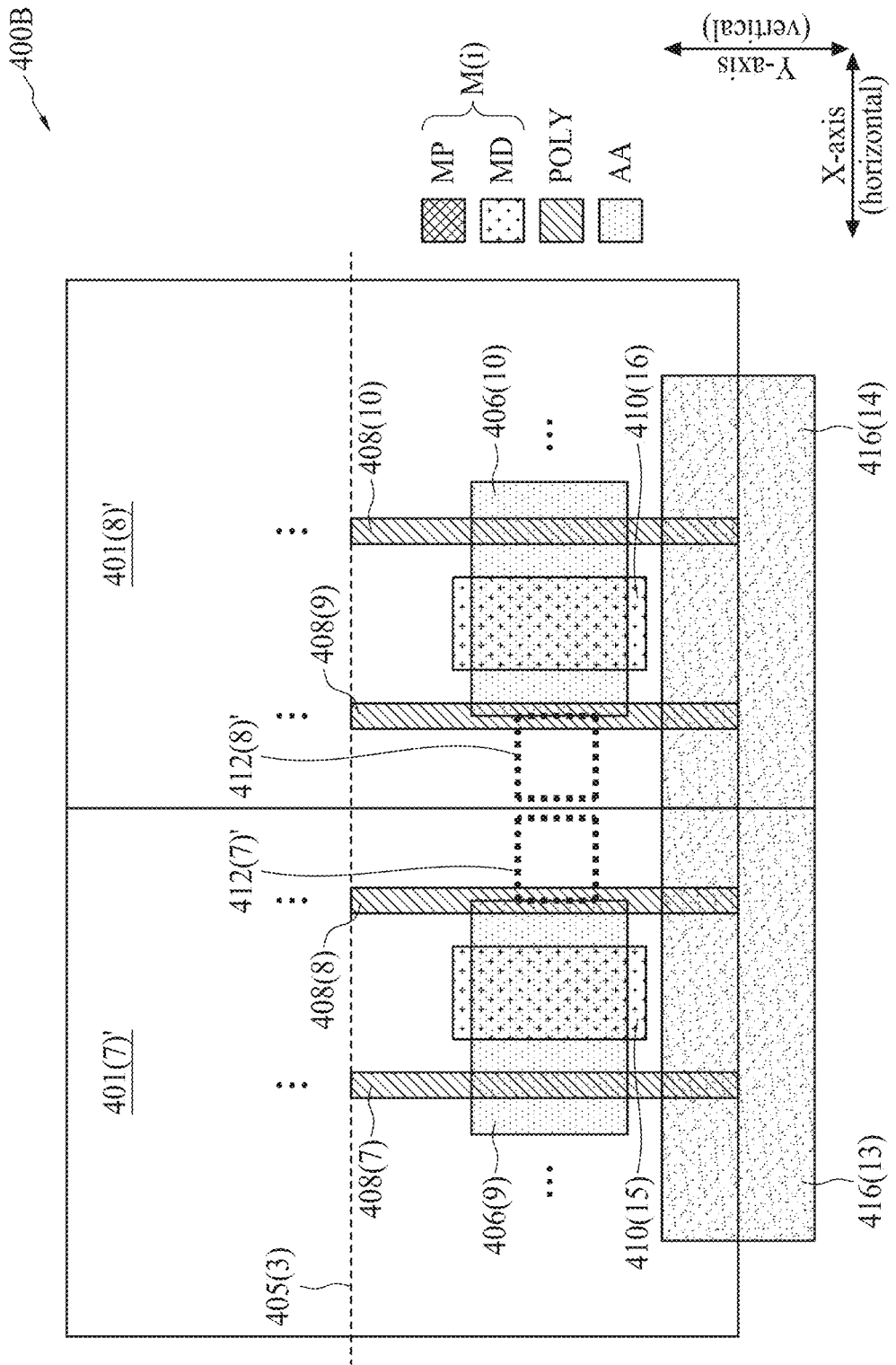

In FIG. 4B, in revised cells 401(7)' and 401(8)', MP patterns 412(7) and 412(8) have been omitted correspondingly as indicated by corresponding phantom MP patterns 412(7)' and 412(8)' in layout diagram 400B.

Figure 4C:
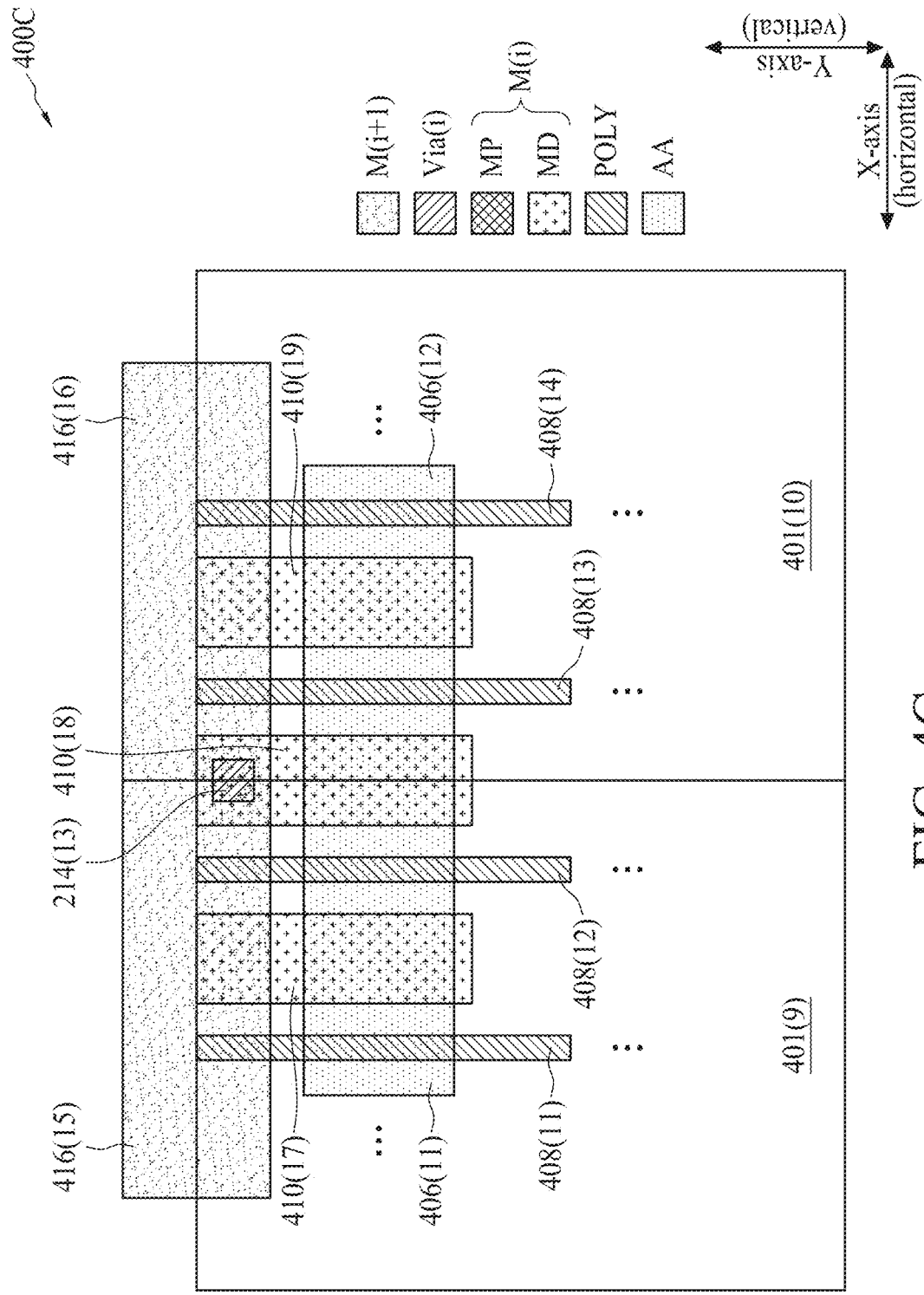

As another example in the context of FIG. 4C, each of AA patterns 406(11) and 406(12) in layout diagram 400C corresponds to AA pattern 306(5) in layout diagram 300, where the parenthetical 11 in 406(11), and the parenthetical 12 in 406(12), and the parenthetical 5 in 306(5) indicate that AA patterns 406(11), 406(12) and 306(5) nevertheless are different from each other.

In FIG. 4C, AA patterns 406(11) and 406(12) abut in the horizontal direction in layout diagram 400C. For purposes of context, FIG. 4C assumes an example in which the portions of AA-pattern 406(11) and AA pattern 406(12) overlapped by MD pattern 410(18) each represent a source side of corresponding arrangements of patterns representing corresponding active transistors. No dummy device is created. Accordingly, an MP pattern is not provided which otherwise would overlap gate pattern 408(12) and MD pattern 410(18), nor is an MP provided which otherwise would overlap gate pattern 408(13) and MD pattern 410(18).

Figure 4D:
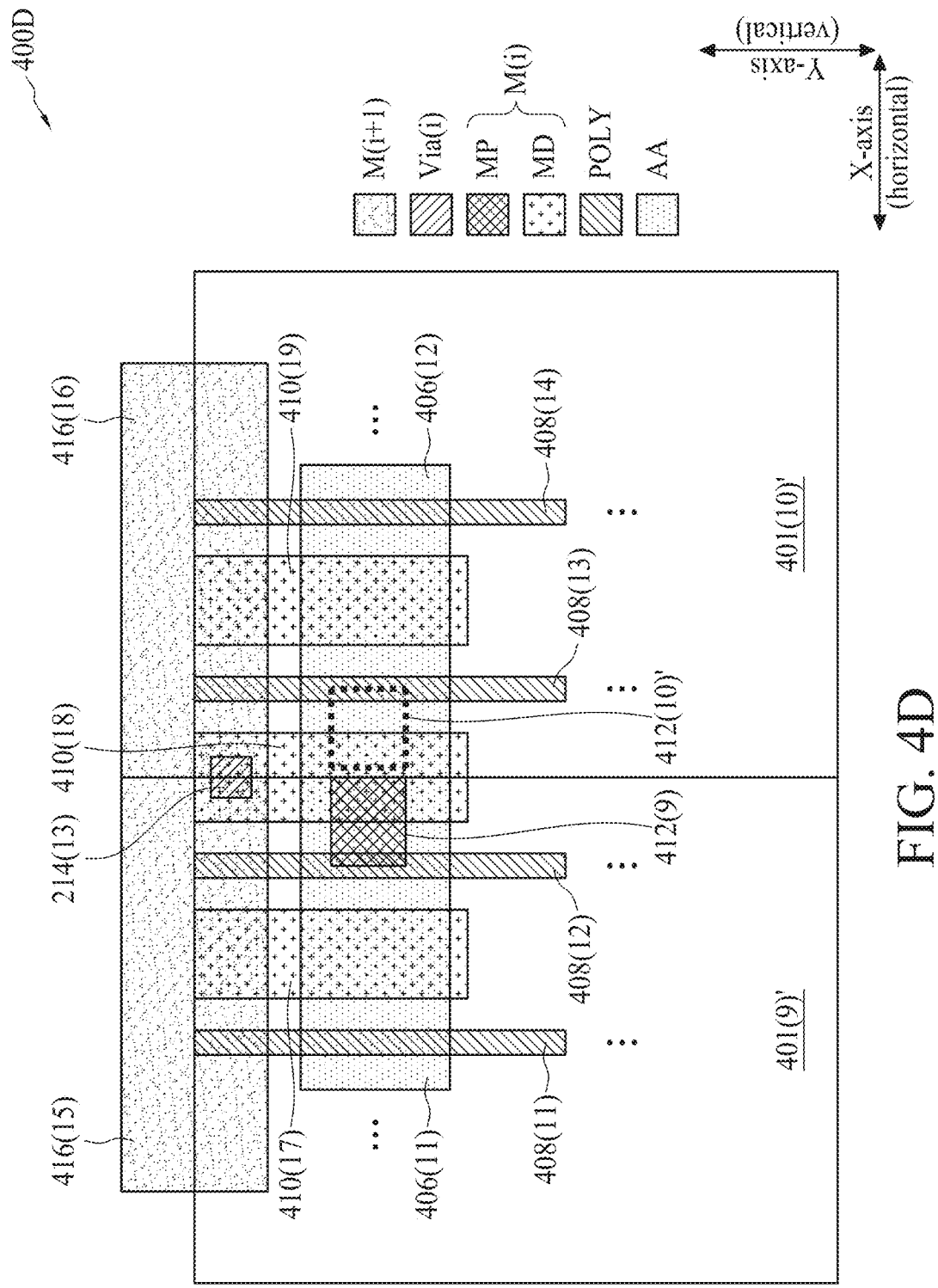

In FIG. 4D, relative to FIG. 4C, MP pattern 412(9) has been added, but MP pattern 412(10) has not been added as indicated by corresponding phantom MP pattern 412(10)' in layout diagram 400D. MP pattern 412(9) and MP phantom pattern 412(10)' abut in the horizontal direction in layout diagram 400D. For purposes of context, FIG. 4D assumes an example in which the portion of AA-pattern 406(11) overlapped by MD pattern 410(18) represents a source side of a corresponding first arrangement of patterns representing a dummy PMOS transistor, and the portion of AA-pattern 406(12) overlapped by MD pattern 410(18) represents a source side of a corresponding second arrangement of patterns representing an active PMOS transistor. For the dummy PMOS transistor represented by the first arrangement, the overlap of gate pattern 408(12) and MD pattern 410(18) by MP pattern 412(9) is an 'always OFF' configuration by which the gate electrode of the dummy transistor is configured to receive VDD and be turned off, which reduces distortion in the operation of the corresponding cell region. Rather than providing a separate group of conductors by which to provide VDD to the gate electrode of the dummy transistor, corresponding layout diagram 400D overlaps gate pattern 408(12) and MD pattern 410(18) with MP pattern 412(9) to take advantage of MD pattern 410(18) already having been configured for VDD.

Figure 4E:
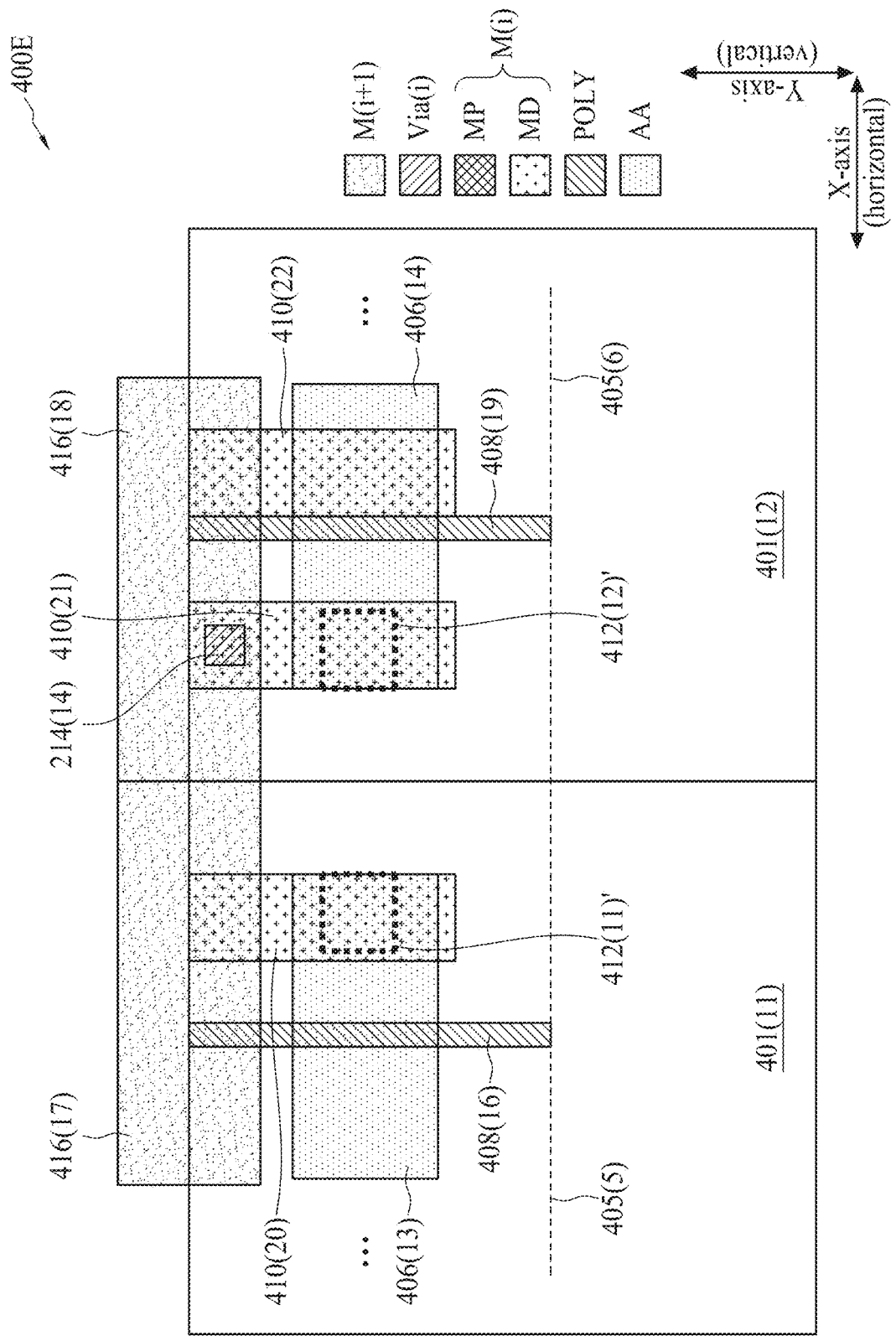

FIG. 4E is similar to FIG. 4B. For brevity, the discussion will focus more on differences between FIG. 4E and FIG. 4B than on similarities. Relative to horizontal midlines 405(5) and 405(4) in FIG. 4E, corresponding upper AA patterns 406(13) and 406(14) are shown, whereas lower AA patterns 406(9) and 406(10) are shown in FIG. 4B relative to corresponding horizontal midlines 405(3) and 405(4).

In FIG. 4E, in cell 401(12)', MP patterns 411(11) and 412(12) have been omitted as indicated by corresponding phantom MP patterns 412(11)' and 412(12)' in FIG. 4E.

Figure 5:
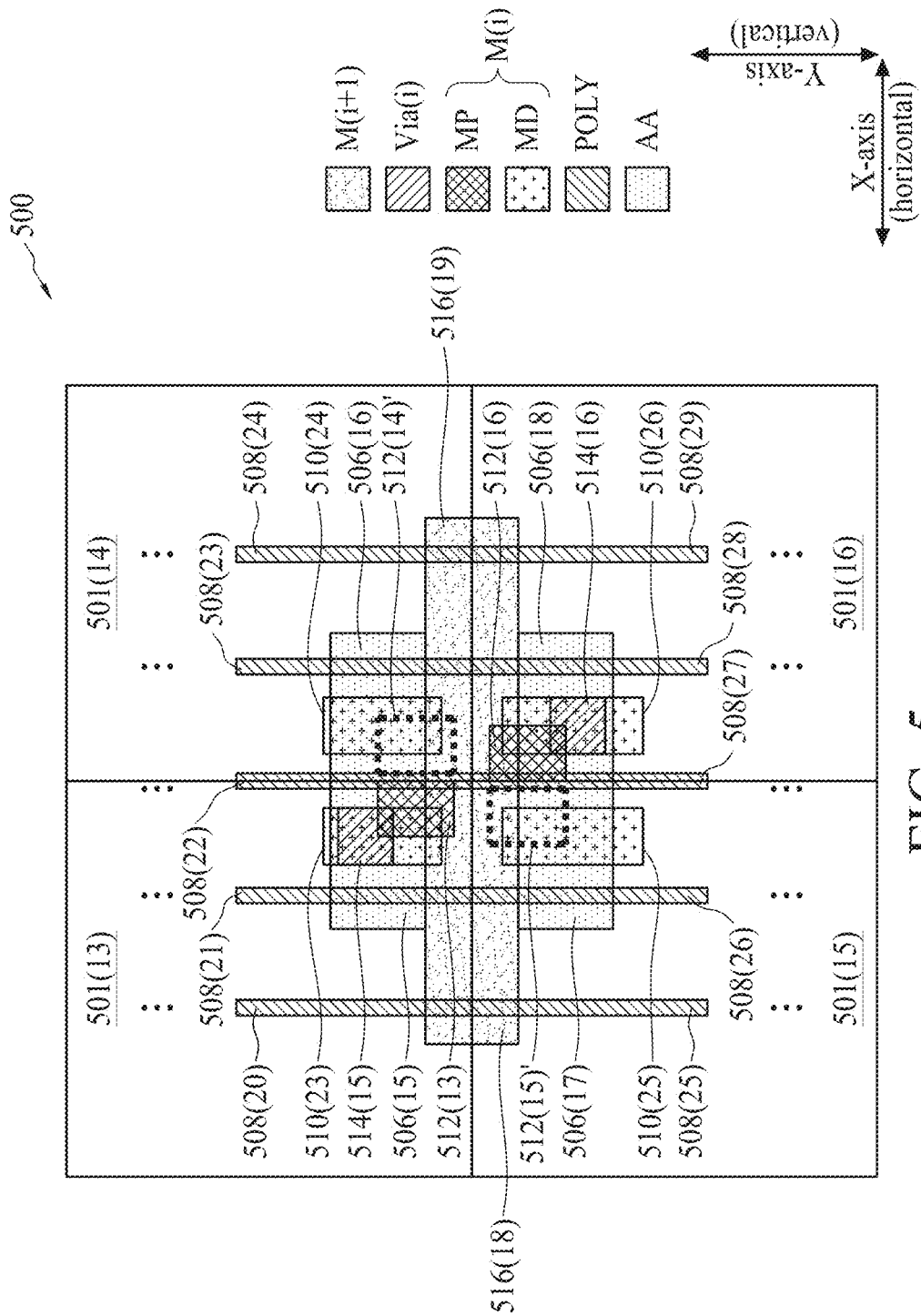
FIG. 5 is a layout diagram, in accordance with some embodiments.

FIG. 5 is a layout diagram 500 for a corresponding semiconductor device, in accordance with at least one embodiment of the present disclosure.

Layout diagram 500 is similar to layout diagram 400D of FIG. 4D. For brevity, the discussion will focus more on differences between layout diagram 500 and layout diagram 400D than on similarities. Elements of layout diagram 500 which are similar to elements of layout diagram 400D have 5-series numbers which track corresponding 4-series numbers in layout diagram 400D, e.g., cell 501(16) is similar to cell 401(10)', where the parenthetical 16 in 501(16) and the parenthetical 10 in 401(10)' indicate that cell 501(16) nevertheless is different than cell 401(10)'. As another example, MP pattern 512(13) is similar to MP pattern 412(10), where the parenthetical 13 in 512(13) and the parenthetical 10 in 412(10) indicate that MP patterns 512(13) and 412(10) are different from each other. As another example, MP pattern 512(16) is similar to MP pattern 412(9), where the parenthetical 16 in 512(16) and the parenthetical 9 in 412(9) indicate that MP patterns 512(16) and 412(9) are different from each other.

In general, cells 501(13)-501(16) in FIG. 5 are gate-pattern-on-edge cell-configurations, whereas cells 401(9)' and 410(10)' in FIG. 4D are not. Accordingly, gate pattern 5018(12) aligns with the right side of cell 501(13) and the left side of cell 501(14). Also, gate pattern 5018(16) aligns with the right side of cell 501(15) and the left side of cell 501(16).

In FIG. 5, in cell 501(15), MP pattern 512(15) has been omitted as shown by phantom MP pattern 512(15)' whereas corresponding MP pattern 412(9) of FIG. 4D is shown in FIG. 4B. For purposes of context, FIG. 5 assumes an example in which MD pattern 510(23) and gate pattern 508(22) are included in a first arrangement of patterns representing a first active transistor, MD pattern 510(23), gate pattern 508(22) and MP pattern 512(13) are included in a first arrangement of patterns representing a first dummy transistor having an always-OFF configuration, MD pattern 510(25) and gate pattern 508(27) are included in a second arrangement of patterns representing a second active transistor, and MD pattern 510(26), gate pattern 508(27) and MP pattern 512(27) are included in a second arrangement of patterns representing a second dummy transistor having an always-OFF configuration. Rather than providing a separate group of conductors by which to provide an appropriate reference voltage to the gate electrodes of the first and second dummy transistor thereby to turn off the same, layout diagram 500 overlaps gate pattern 508(22) and MD pattern 510(23) with MP pattern 512(13), and gate pattern 508(27) and MD pattern 510(26) with MP pattern 512(16), to take corresponding advantage of MD patterns 510(23) and 510(26) already having been configured for the appropriate reference voltage.

In cell 501(13), MP pattern 512(13) is shown whereas MP pattern 512(15) of cell 501(14) has been omitted as indicated by phantom MP pattern 512(14)' in cell 501(14). Relative to the vertical direction, MP patterns 512(13) and 512(14) are shown closer to corresponding bottom and top sides of corresponding cells 501(13) and 501(16) than MP pattern 412(10) is shown in FIG. 4D relative to the top side of cell 401(10)'.

Figure 6:
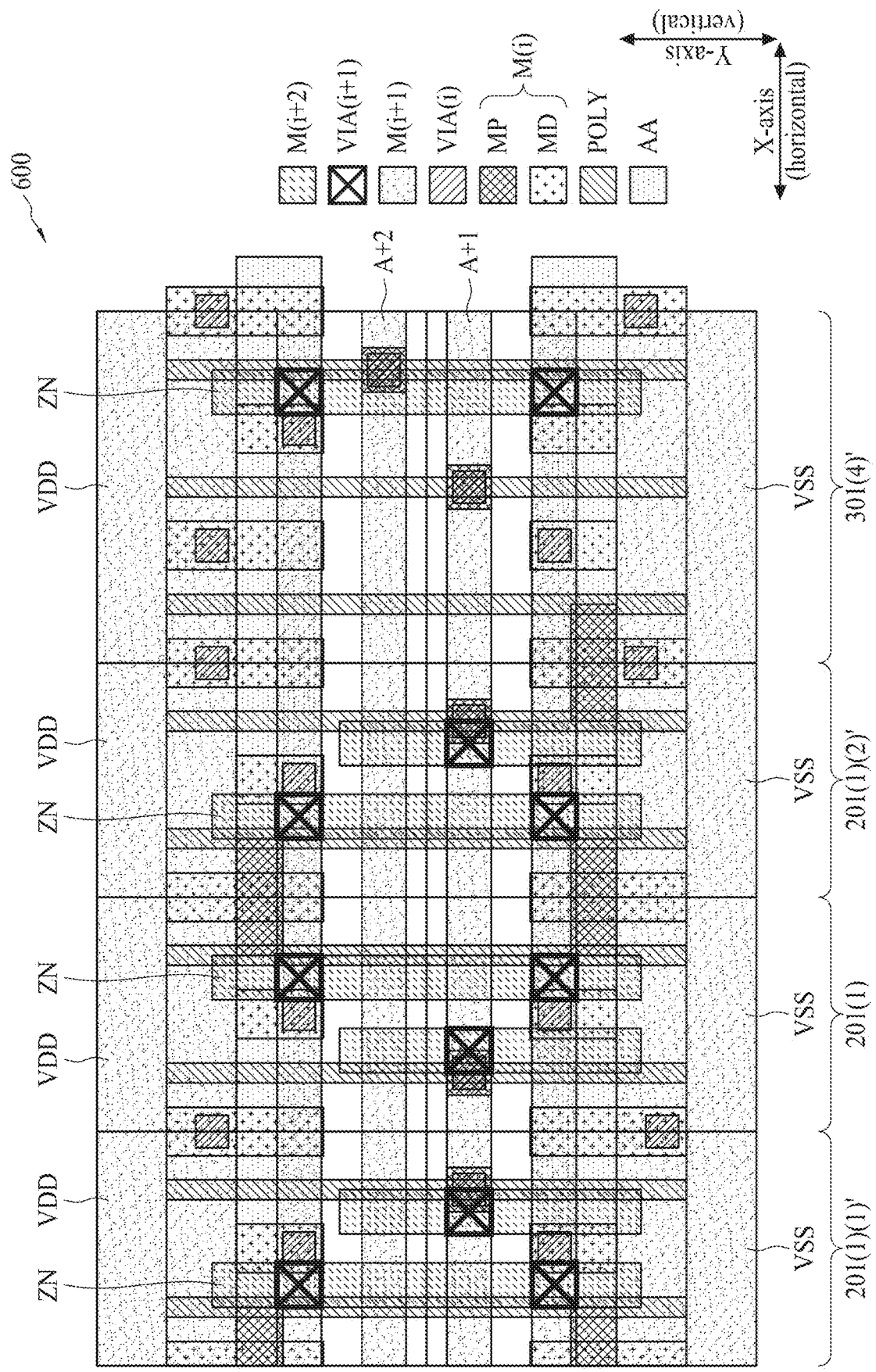
FIG. 6 is a layout diagram, in accordance with some embodiments.

FIG. 6 is a layout diagram 600 for a corresponding semiconductor device, in accordance with at least one embodiment of the present disclosure.

Layout diagram 600 is similar to layout diagram 200A. For brevity, the discussion will focus more on differences between layout diagram 600 and layout diagram 200A than on similarities.

In FIG. 6, layout diagram 600 includes cell 201(1), 201(1)(1)', 201(1)(2)' and 301(4)', which are shown in the same row.

Relative to the horizontal direction, cell 201(1) is disposed between cells 201(1)(1)' and 201(1)(2)'. Cell 201(1) (1)' abuts the left side of cell 201(1) and cell 201(1)(2)' abuts the right side of cell 201(1). Relative to the horizontal direction, cell 201(1(2)') is disposed between cells 201(1) and 301(4)'. Cell 201(1) abuts the left side of cell 201(1)(2)' and cell 301(4)' abuts the right side of cell 201(1)(2)'.

Taking left side 204_L of cell 201(1) as an axis symmetry, cell 201(1)(1)' is mirror symmetric to cell 201(1). Taking right side 204_R of cell 201(1) as an axis symmetry, cell 201(1)(2)' is mirror symmetric to cell 201(1). Taking right side 304_R(2) of cell 301(4) as an axis symmetry, cell 301(4)' *is* mirror symmetric to cell 301(4).

FIGS. 7A-7E are corresponding layout diagrams 700A-700E for corresponding semiconductor devices, in accordance with at least one embodiment of the present disclosure.

Layout diagrams 700A-700E are similar to layout diagram 400E of FIG. 4E. For brevity, the discussion will focus more on differences between layout diagrams 700A-700E and layout diagram 400E than on similarities. Elements of layout diagrams 700A-700E which are similar to elements of layout diagram 400E have 7-series numbers which track corresponding 4-series numbers in layout diagram 400E, e.g., cell 701(20)' is similar to cell 401(12), where the parenthetical 20 in 701(20)' and the parenthetical 12 in 401(12)' indicate that cells 701(20)' and 401(12)' are different.

For simplicity of illustration, layout diagrams 700A-700E correspondingly are simplified in some respects to corresponding layout diagram 400E; accordingly some elements in layout diagrams 700A-700E which correspond to elements in layout diagram 400E nevertheless are not shown in layout diagrams 700A-700E.

Figure 7A:
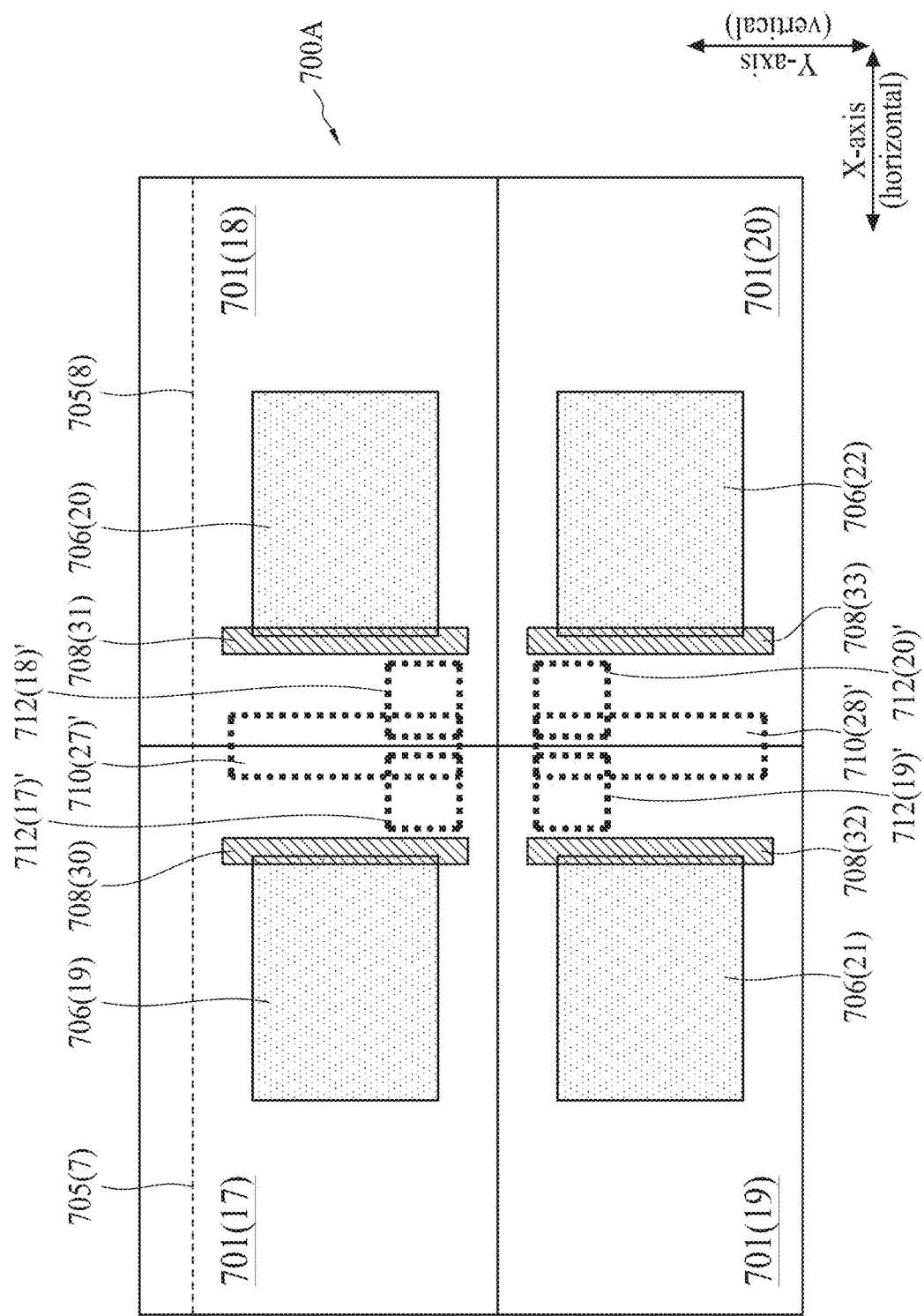

Relative to horizontal midlines 705(7) and 705(8) in FIG. 7A, corresponding lower AA patterns 706(19) and 706(20) are shown in corresponding cells 701(17) and 701(18), whereas upper AA patterns 406(13) and 406(14) are shown in FIG. 4E relative to corresponding horizontal midlines 405(5) and 405(6).

In FIG. 7A, relative to the horizontal direction, cells 701(17) and abutting cell 701(18) are located in a first row, and cell 701(19) and abutting cell 701(20) are located in a second row, the first row being located on the second row. The right side of cell 701(17) abuts the left side of cell 701(18). The right side of cell 701(19) abuts the left side of cell 701(19). The long axis of gate pattern 708(30) of cell 701(17) is substantially collinear with the long axis of gate pattern 708(32) of cell 701(19). The long axis of gate pattern 708(31) of cell 701(18) is substantially collinear with the long axis of gate pattern 708(33) of cell 701(20).

In FIG. 7A, MP patterns 712(17), 712(18), 712(19) and 712(20) have been omitted from corresponding cells 701 (17), 701(18), 701(19) and 701(20) as shown by corresponding phantom MP patterns 712(17), 712(18), 712(19) and 712(2). Also, MD patterns 710(27) and 710(28) have been omitted from corresponding cells 701(17) & 701(18) and 701(19) & 701(20) as shown by corresponding phantom MD patterns 701(27)' and 710(28)'. In some embodiments, the omission of MP patterns 712(17), 712(18), 712(19) and 712(20) is a result of having omitted or having removed corresponding body-MP-tie arrangements.

Figure 7B:
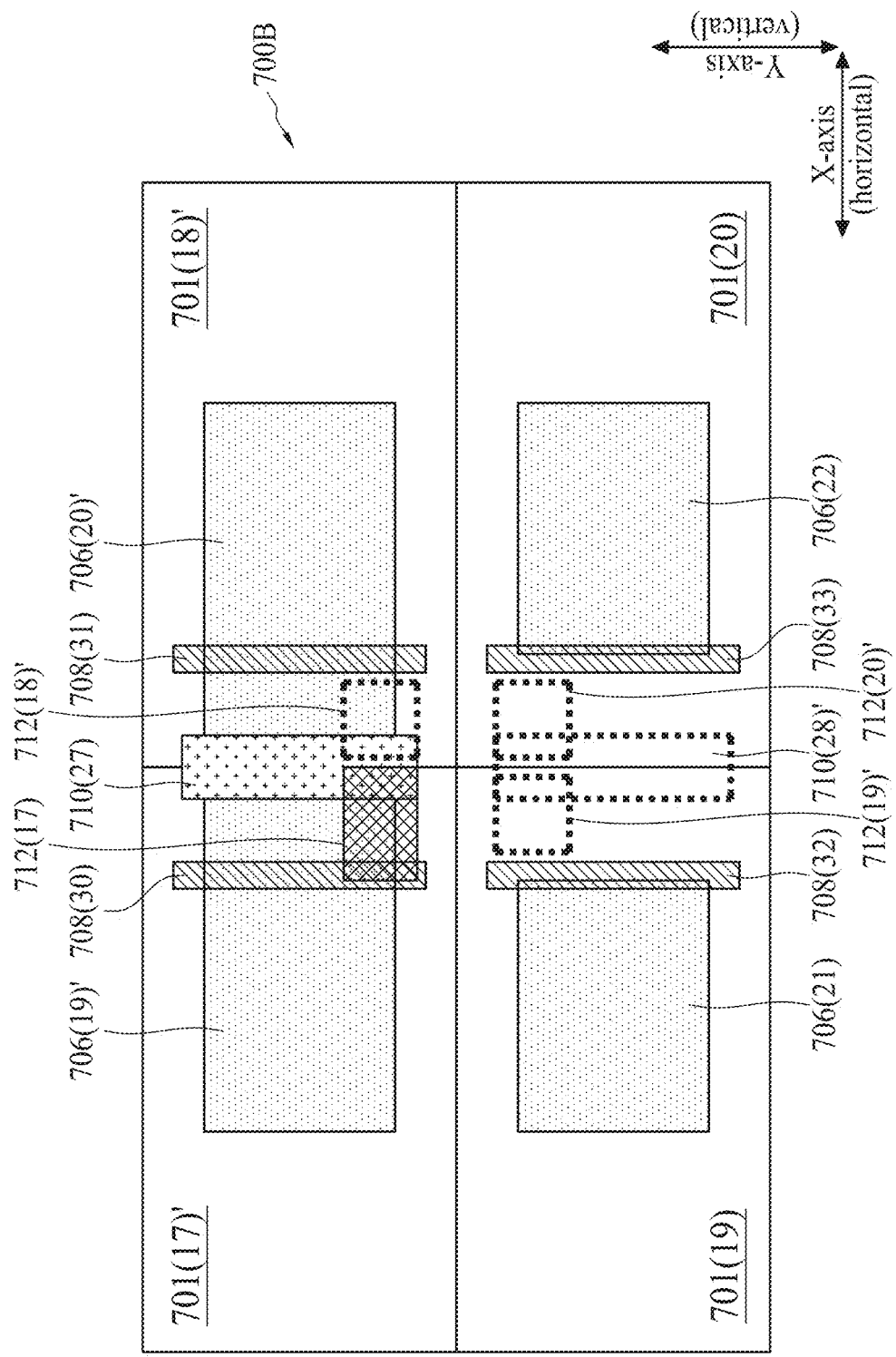

In FIG. 7B, as compared to FIG. 7A, MP pattern 712(17) has been added to cell 701(17)', and MD pattern 710(27) has been added to cells 701(17)' & 701(18)'. In some embodiments, the arrangement of MD pattern 710(27), MP pattern 712(17) and gate pattern 708(30) is an example of a body-MP-tie arrangement. In some embodiments, the omission of MP patterns 712(18), 712(19) and 712(20) is a result of having omitted or having removed corresponding body-MP-tie arrangements.

In FIG. 7C, as compared to FIG. 7A, MD pattern 710(27) has been added to cells 701(17)" & 701(18)'. In some embodiments, the omission of MP patterns 712(17), 712 (18), 712(19) and 712(20) is a result of having omitted or having removed corresponding body-MP-tie arrangements.

Figure 7D:
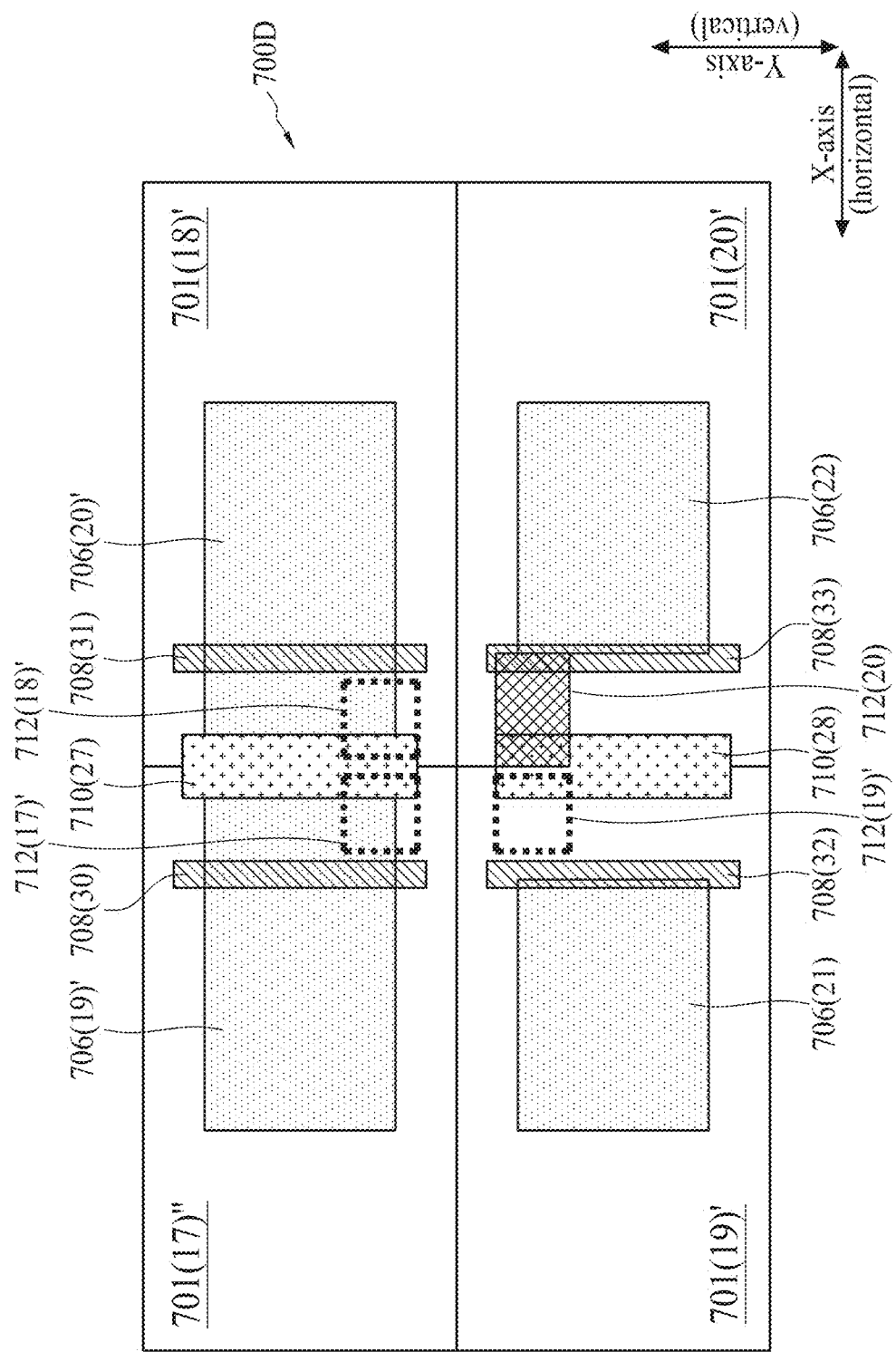

In FIG. 7D, as compared to FIG. 7A, MP pattern 712(20) has been added to cell 701(20)', and MD patterns 710(27) and 710(28) have been added to corresponding cells 706 (17)" & 701(18)' and 701(19)' & 701(20)'. In some embodiments, the arrangement of MD pattern 710(28), MP pattern 712(20) and gate pattern 708(33) is an example of a body-MP-tie arrangement. In some embodiments, the omission of MP patterns 712(17), 712(18) and 712(19) is a result of having omitted or having removed corresponding body-MP-tie arrangements.

Figure 7E:
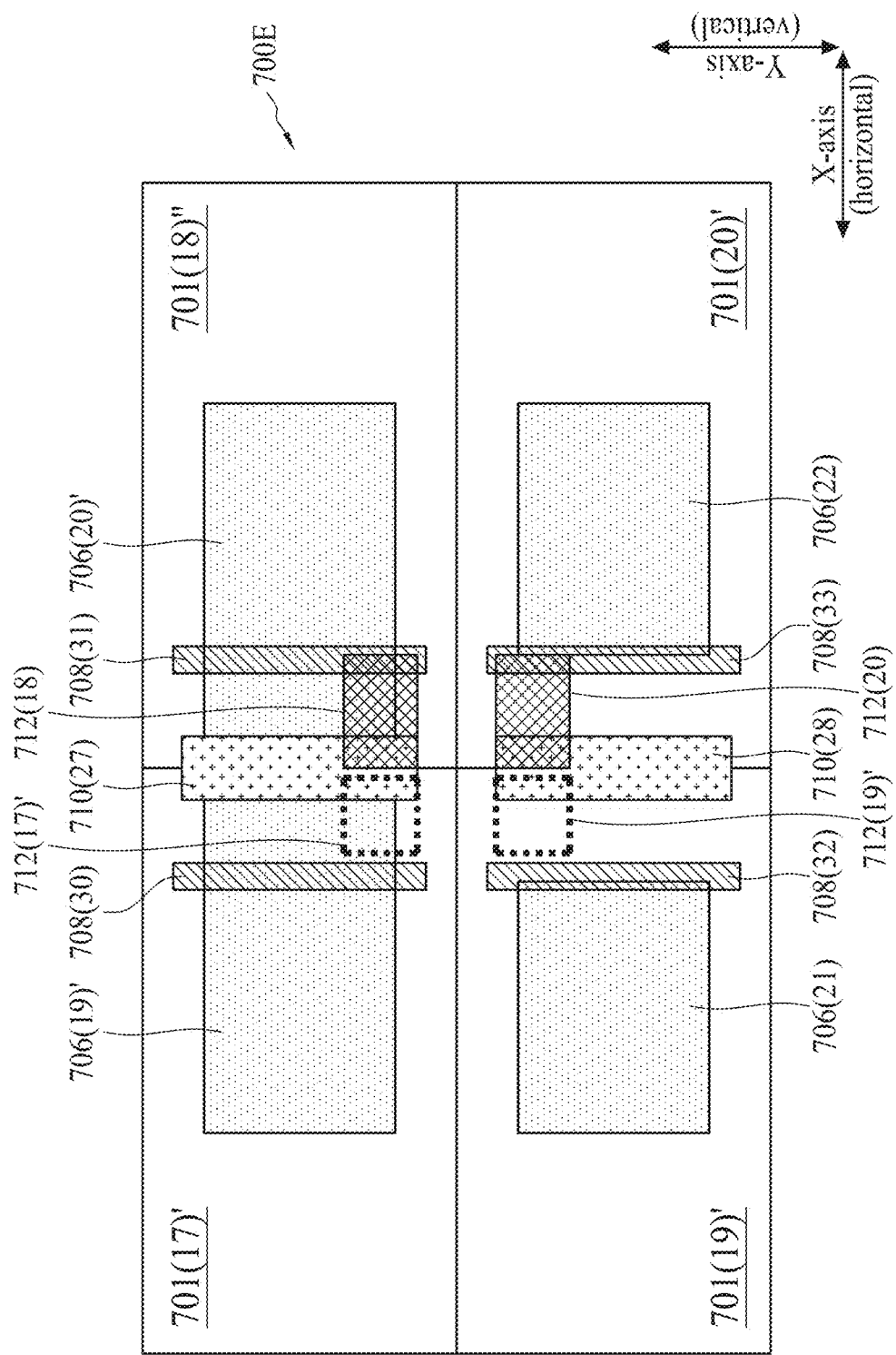

In FIG. 7E, as compared to FIG. 7A, MP patterns 712(18) and 712(20) have been added to corresponding cells 701 (18)' and 701(20)', and MD patterns 710(27) and 710(28) have been added to corresponding cells 706(17)" & 701(18)' and 701(19)' & 701(20)'. In some embodiments, each of the arrangement of MD pattern 710(27), MP pattern 712(18) and gate pattern 708(31), and the arrangement of MD pattern 710(28), MP pattern 712(20) and gate pattern 708(33), is an example of a body-MP-tie arrangement. In some embodiments, the omission of MP patterns 712(17) and 712(19) is a result of having omitted or having removed corresponding body-MP-tie arrangements.

FIGS. 8A-8L are corresponding layout diagrams 800A-800L for corresponding semiconductor devices, in accordance with at least one embodiment of the present disclosure.

Layout diagrams 800A-800E and 800G-800K correspondingly are similar to layout diagrams 700A-700E, and layout diagram 800F and 800L correspondingly are similar to layout diagrams 700B and 700D. For brevity, the discussion will focus more on differences between layout diagrams 800A-800F and 800G-800L and corresponding layout diagrams 700A-700E than on similarities. Elements of layout diagrams 800A-800F and 800G-800L which are similar to corresponding elements of layout diagrams 700A-700E have 8-series numbers which track corresponding 7-series numbers in corresponding layout diagrams 700A-700E, e.g., cell 801(21)' in FIG. 8F is similar to cell 701(17)' in FIG. 7B, where the parenthetical 21 in 801(21)' and the parenthetical (17) in 701(17) indicate that cells 801(31)' and 701(17)' nevertheless are different.

Figure 8A:
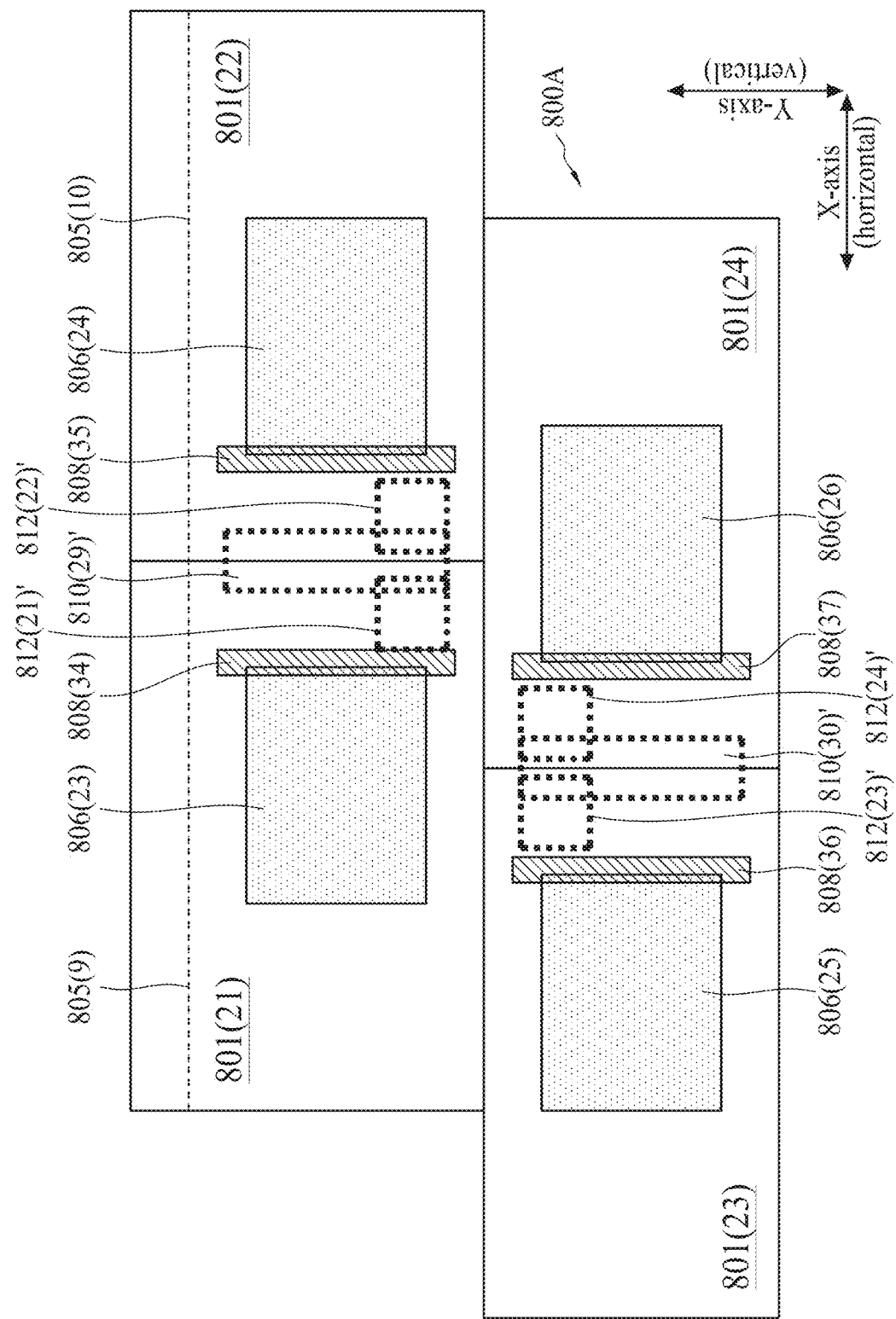
Figure 8C:
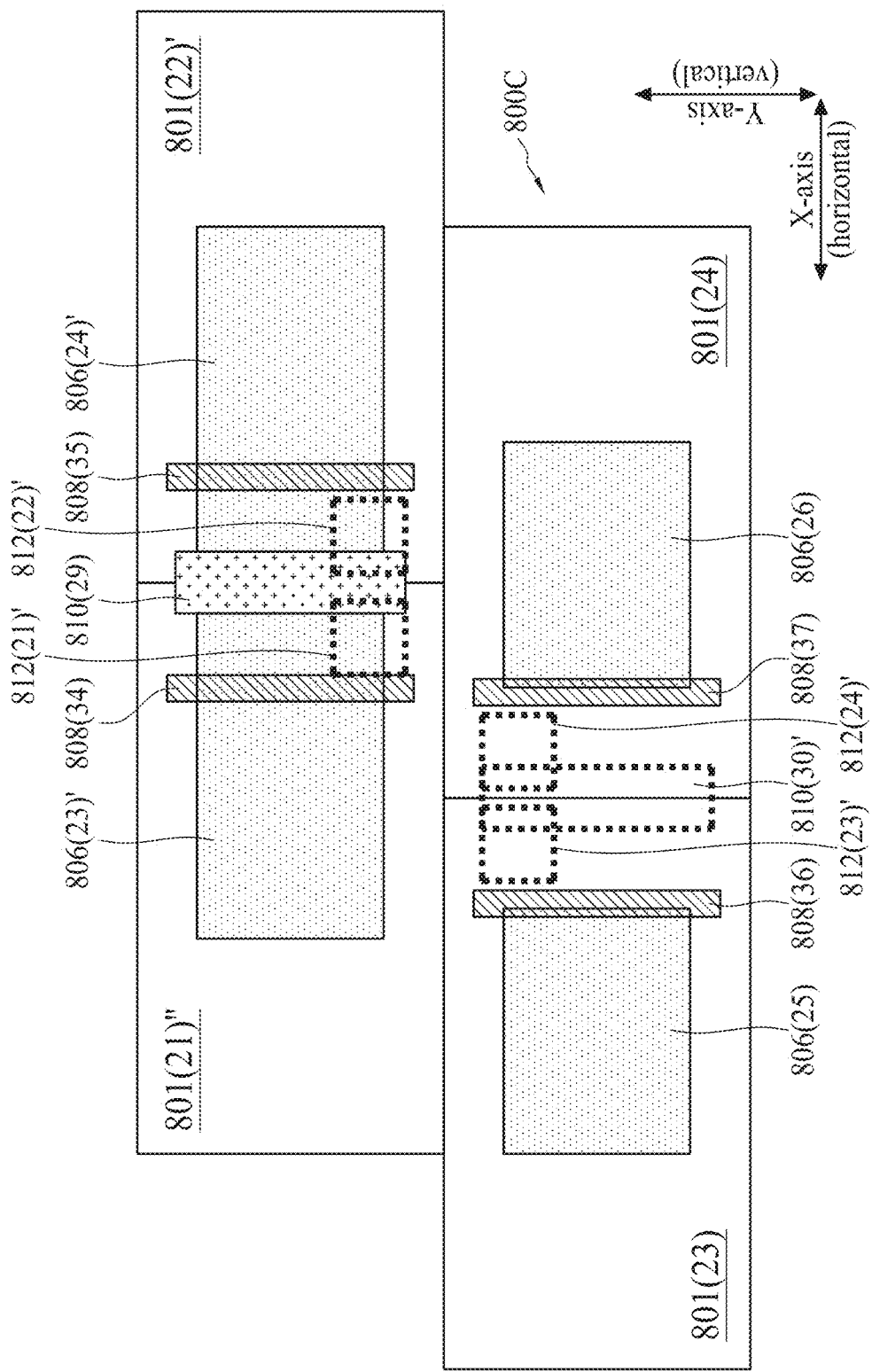
Figure 8D:
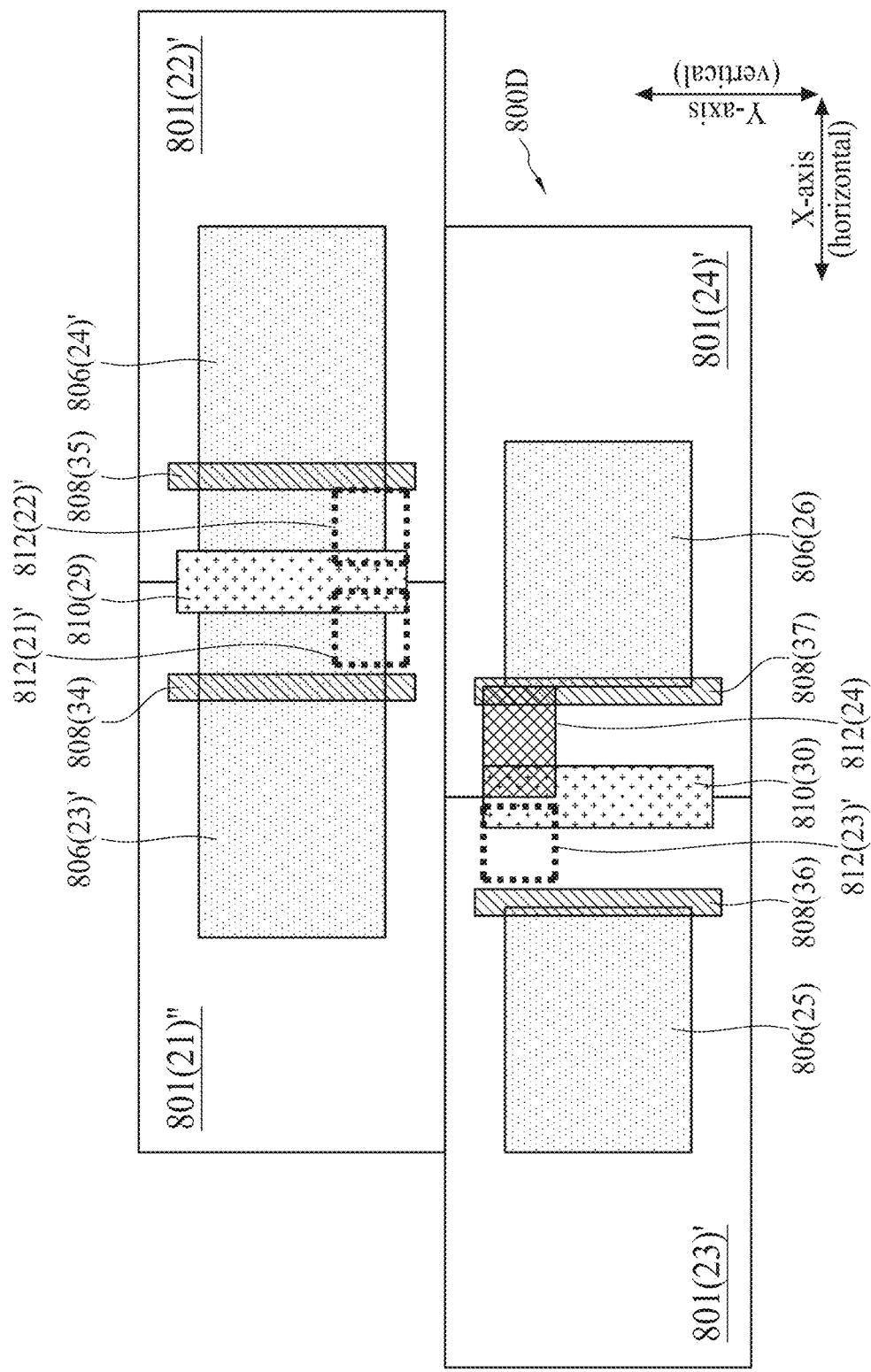

In FIG. 8A, relative to the horizontal direction, cell 801(21) and abutting cell 801(22) are shifted to the right relative to cell 801(23) and abutting cell 801(24). As a result, the long axis of gate pattern 808(34) of cell 801(21) is substantially collinear with the long axis of gate pattern 808(37) of cell 801(24). In some embodiments, relative to the horizontal direction, cell 801(21) and abutting cell 801(22) are shifted to the left (not shown) relative to cell 801(23) and abutting cell 801(24). As a result in some embodiments, the long axis of gate pattern 808(35) of cell 801(22) is substantially collinear (not shown) with the long axis of gate pattern 808(36) of cell 801(23). FIGS. 8B-8E are similarly shifted to the right relative to corresponding FIGS. 7B-7E.

Figure 8E:
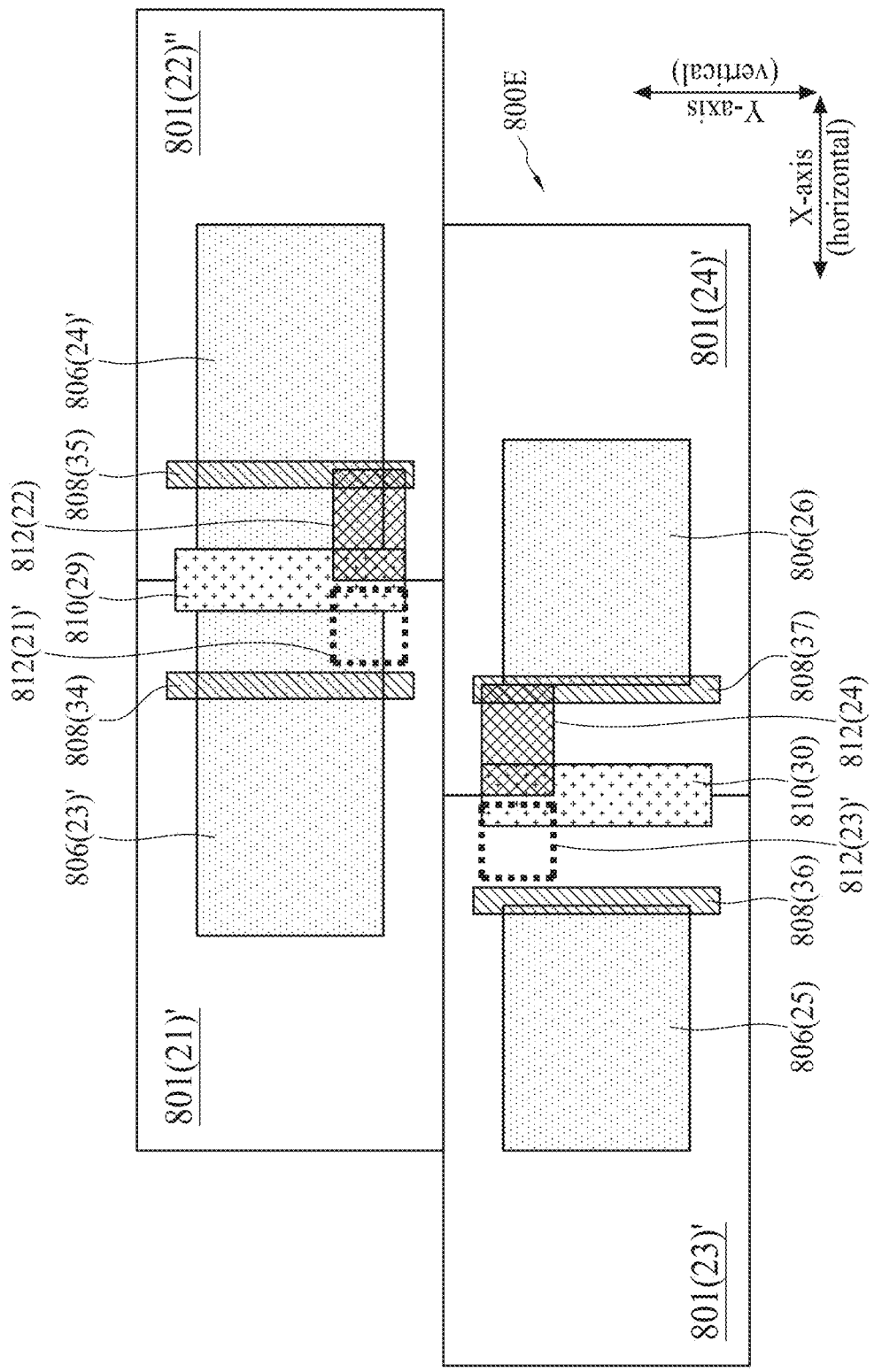
Figure 8F:
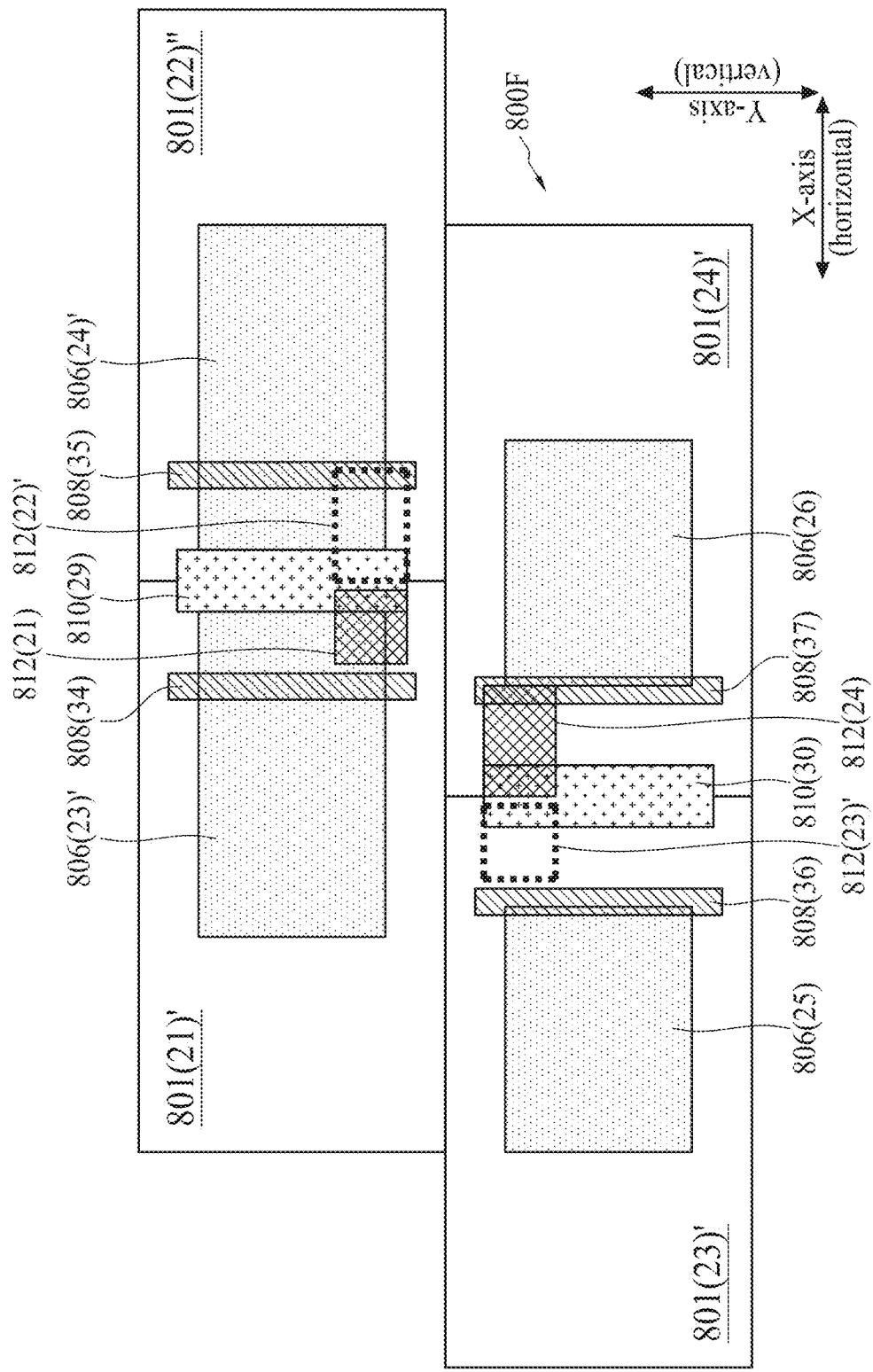

In FIG. 8F, as compared to FIG. 8E, MP pattern 812(21) has been added to cell 801(21)', MP pattern 812(22) has been omitted from cell 801(22)" as shown by phantom MP pattern 812(22)'. In some embodiments, each of the arrangement of MD pattern 810(29), MP pattern 812(21) and gate pattern 808(34), and the arrangement of MD pattern 810(30), MP pattern 812(24) and gate pattern 808(37), is an example of a body-MP-tie arrangement. In some embodiments, the omission of MP patterns 812(22) and 812(23) is a result of having omitted or having removed corresponding body-MP-tie arrangements. Relative to the horizontal direction, FIG. 8F is similarly shifted to the right relative to corresponding FIGS. 7B and 7D.

Figure 8G:
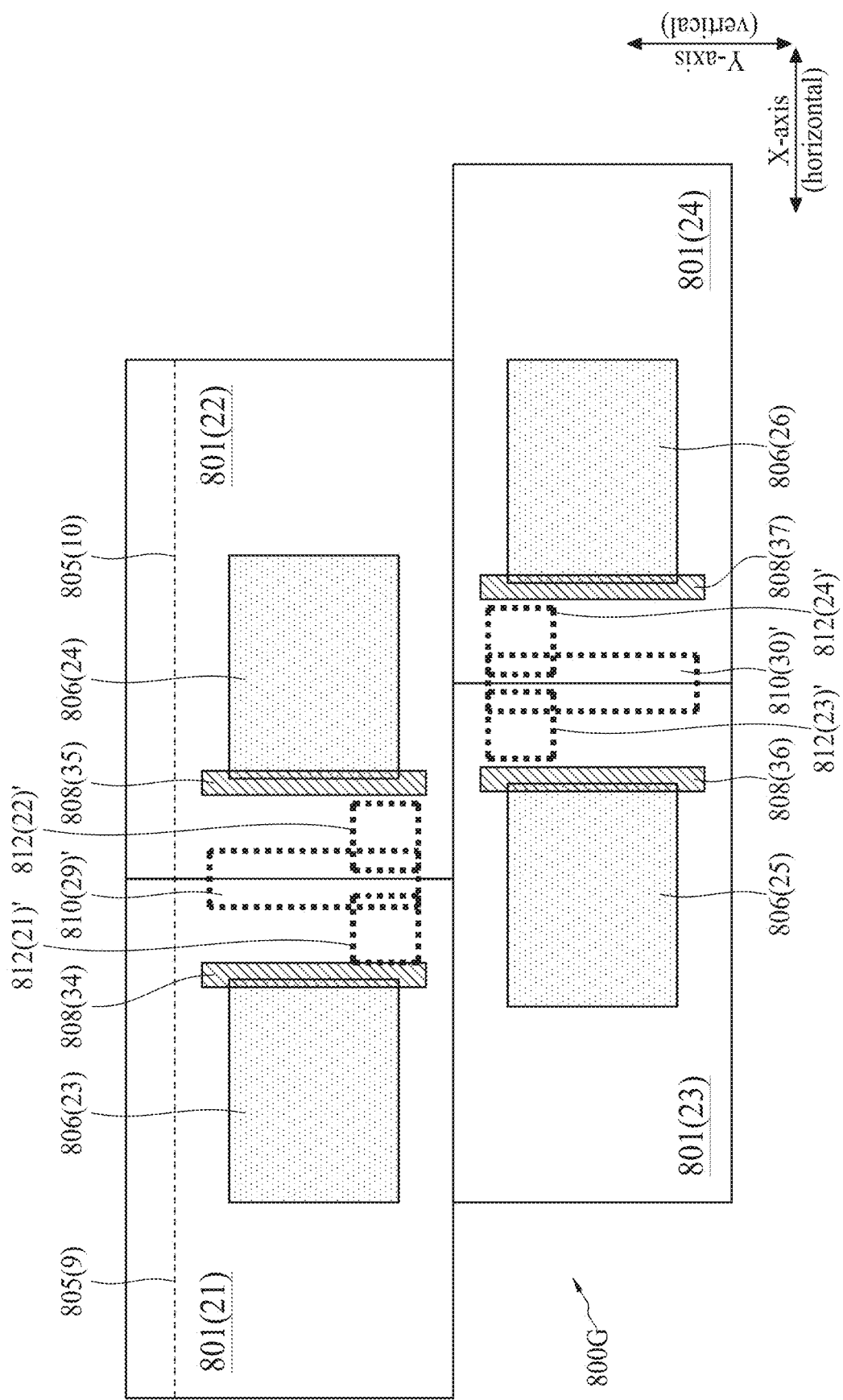
Figure 8H:
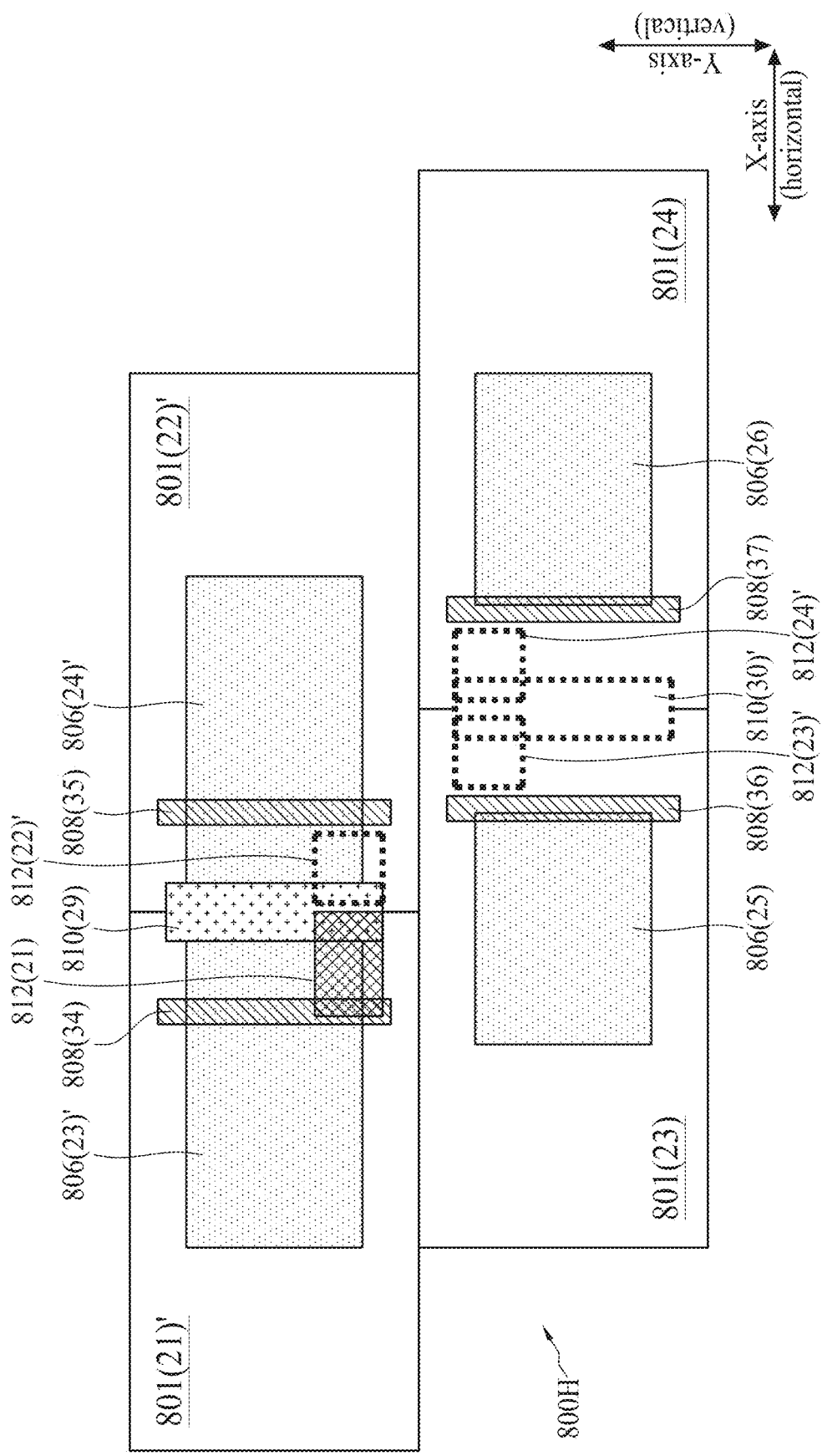
Figure 8I:
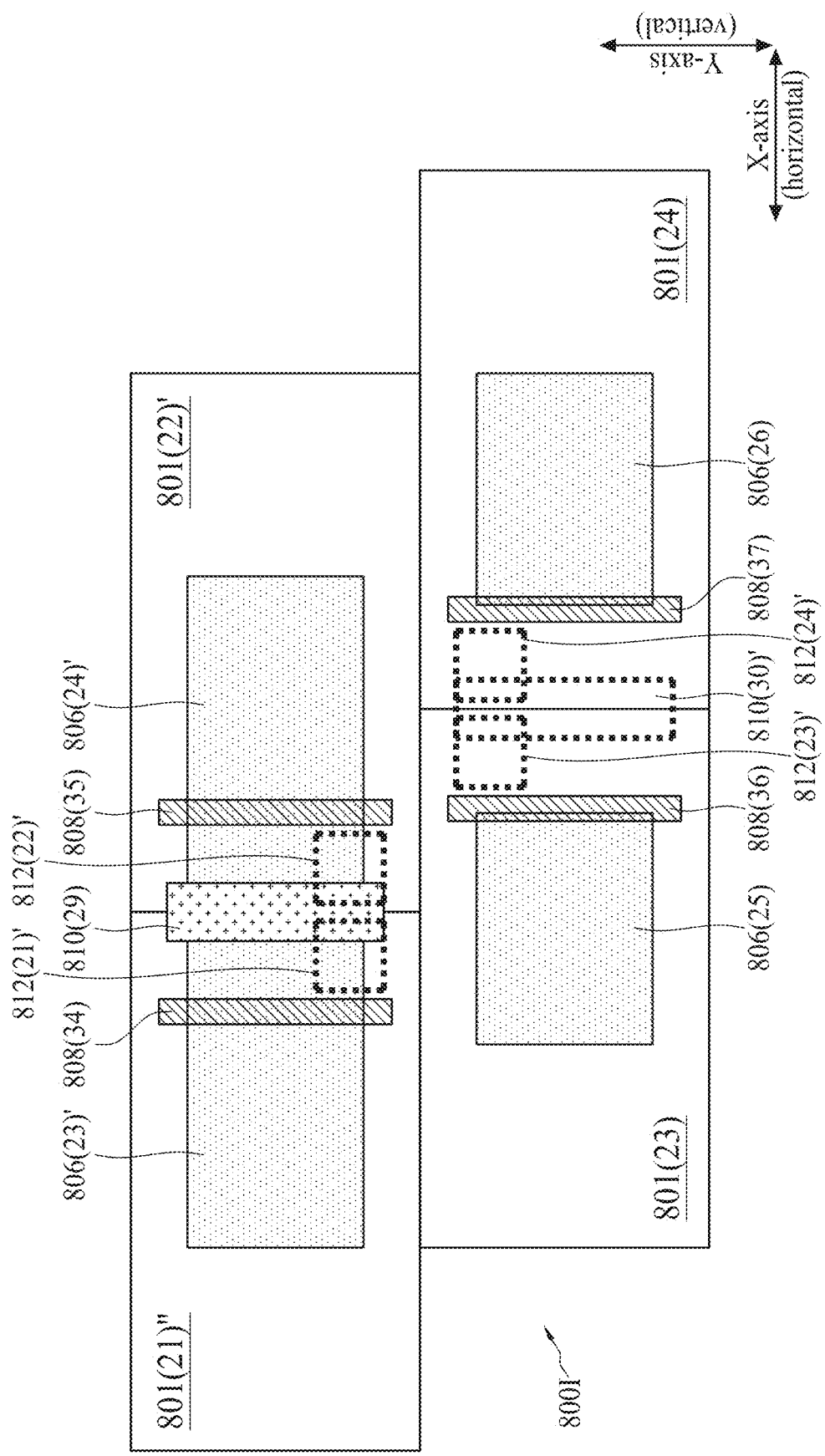
Figure 8J:
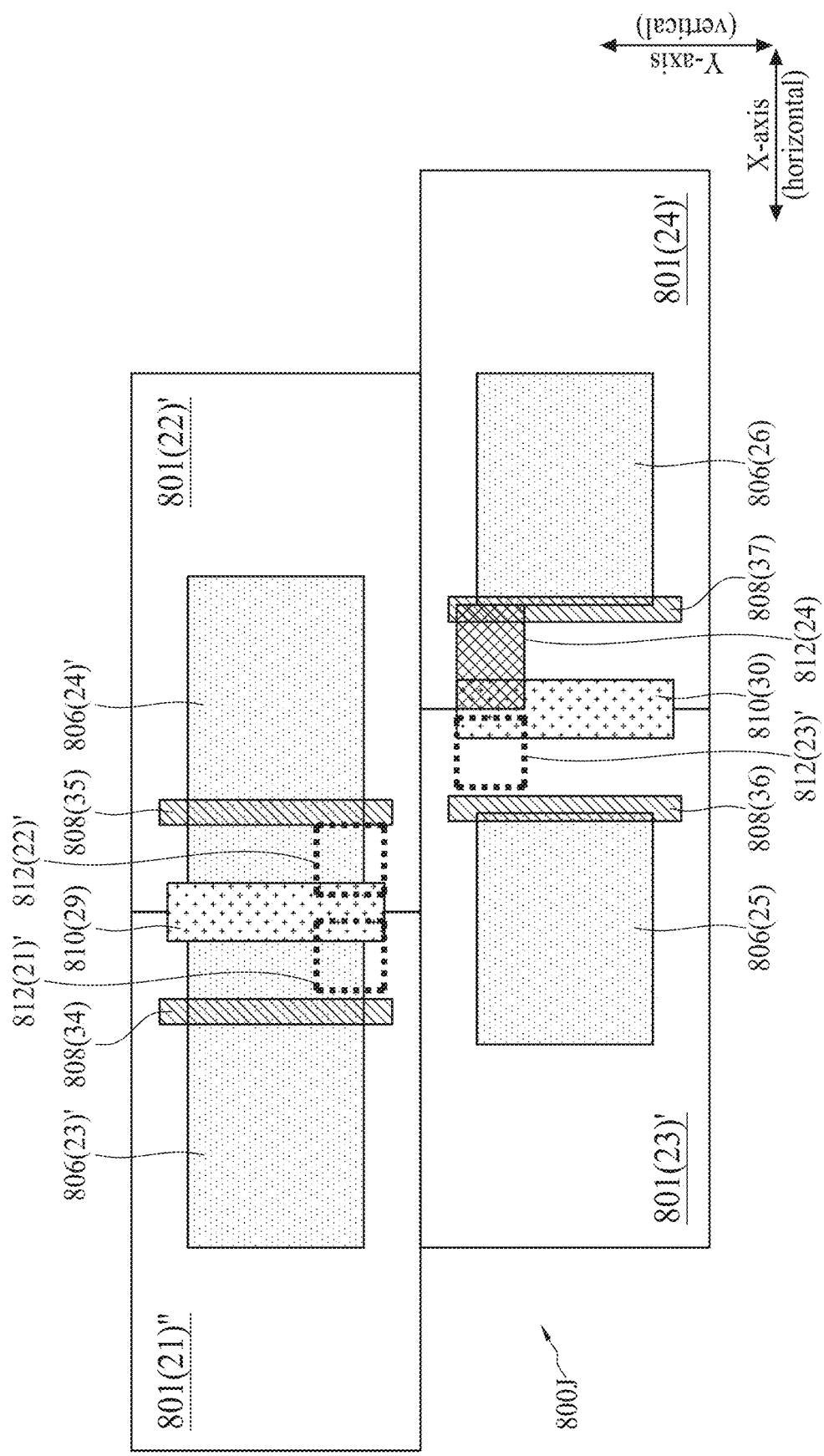

In FIG. 8G, relative to the horizontal direction, cell 801(21) and abutting cell 801(22) are shifted to the left relative to cell 801(23) and abutting cell 801(24). As a result, the long axis of gate pattern 808(35) of cell 801(22) is substantially collinear with the long axis of gate pattern 808(36) of cell 801(23). FIGS. 8H-8K are similarly shifted to the left relative to corresponding FIGS. 7B-7E.

Figure 8K:
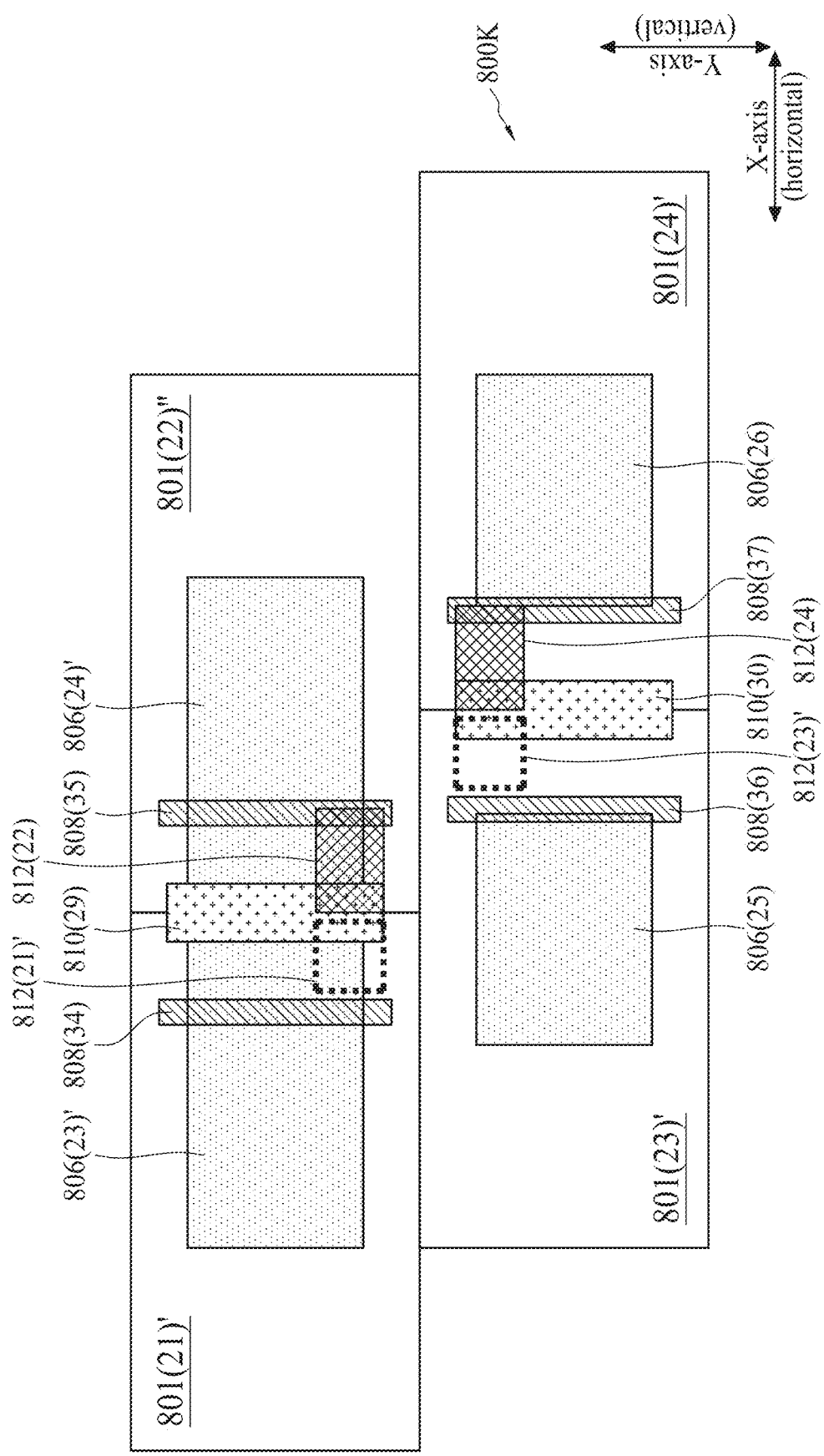
Figure 8L:
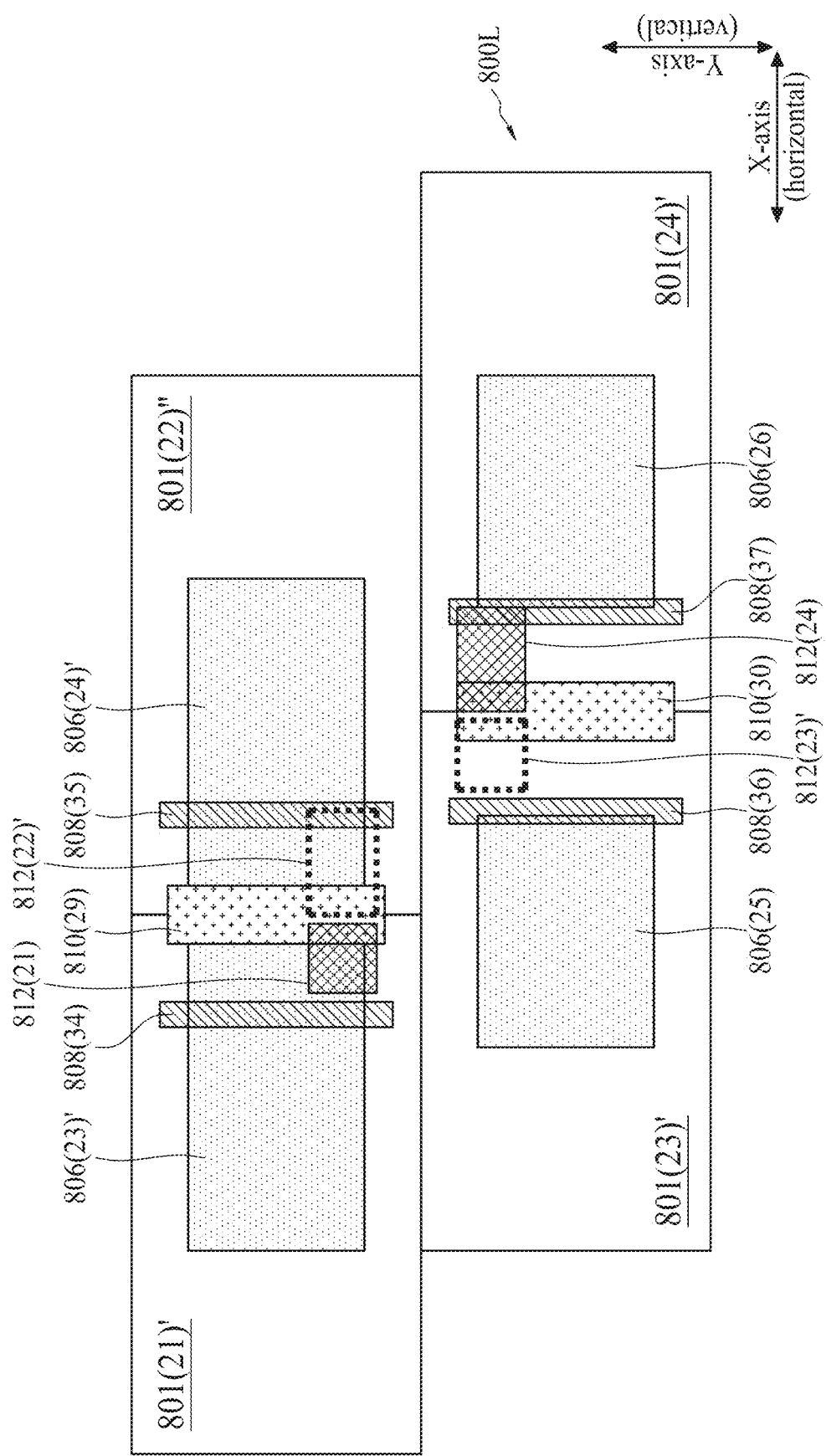

In FIG. 8L, as compared to FIG. 8K, MP pattern 812(21)' has been added to cell 801(21)', MP pattern 812(22) has been omitted from cell 801(22)" as shown by phantom MP pattern 812(22)'. In some embodiments, each of the arrangement of MD pattern 810(29), MP pattern 812(21) and gate pattern 808(34), and the arrangement of MD pattern 810(30), MP pattern 812(24) and gate pattern 808(37), is an example of a body-MP-tie arrangement. In some embodiments, the omission of MP patterns 812(22) and 812(23) is a result of having omitted or having removed corresponding body-MP-tie arrangements. Relative to the horizontal direction, FIG. 8L is similarly shifted to the left relative to corresponding FIGS. 7B and 7D.

Figure 9:
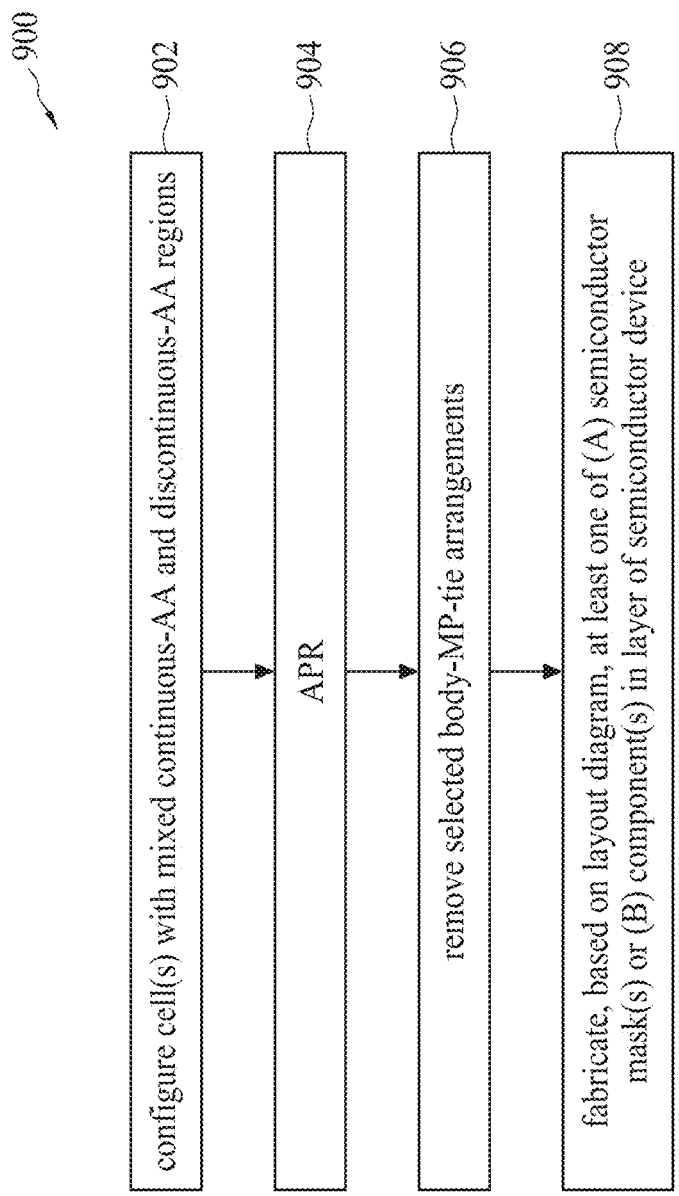
FIG. 9 is a flowchart of a method of generating a layout diagram, in accordance with one or more embodiments.

FIG. 9 is a flowchart of a method 900 of generating a layout diagram, in accordance with one or more embodiments.

Examples of layout diagrams which can be generated according to method 900 include the layout diagrams disclosed herein, or the like. In some embodiments, the layout diagram and versions thereof are stored on a non-transitory computer-readable medium, e.g., memory 1104 in FIG. 11 (discussed below). Method 900 is implementable, for example, using EDA system 1100 (FIG. 11, discussed below), in accordance with some embodiments.

In FIG. 9, method 900 includes blocks 902. At block 902, one or more cells in the layout diagram are configured with a mix of at least one AA-continuous configuration and at least one AA-discontinuous configuration. Examples of cells having a mix of at least one AA-continuous configuration and at least one AA-discontinuous configuration include cell 201(1) of FIG. 2A, cell 301(1) of FIG. 3, or the like. From block 902, flow proceeds to block 904.

At block 904, the layout diagram is subjected to automatic placement and routing (APR). From block 904, flow proceeds to block 906. At block 906, selected body-MP-tie-arrangements are removed. Examples of layout diagrams in which body-MP-tie-arrangements have been selectively removed include FIGS. 7A-7E, 8A-8F, or the like. From block 906, flow proceeds to block 908.

At block 908, based on the layout diagram, at least one of (A) one or more semiconductor masks or (B) at least one component in a layer of a semiconductor device is fabricated. See discussion below of FIG. 12. In some embodiments, the fabricating further includes performing one or more lithographic exposures based on the revised layout diagram.

Figure 10A:
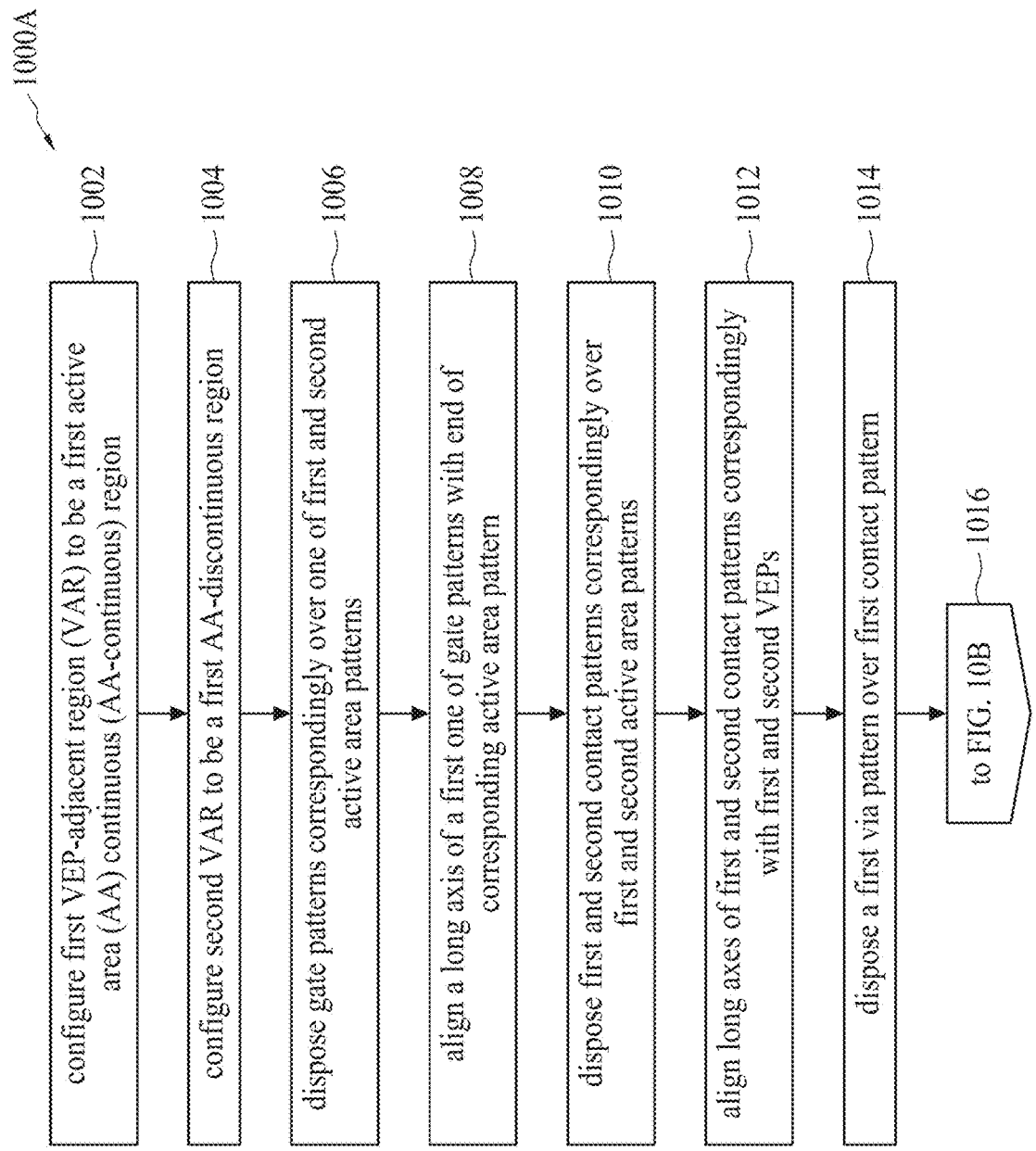
FIGS. 10A-10B are corresponding flowcharts of corresponding methods of generating a layout diagram, in accordance with one or more embodiments.
Figure 10B:
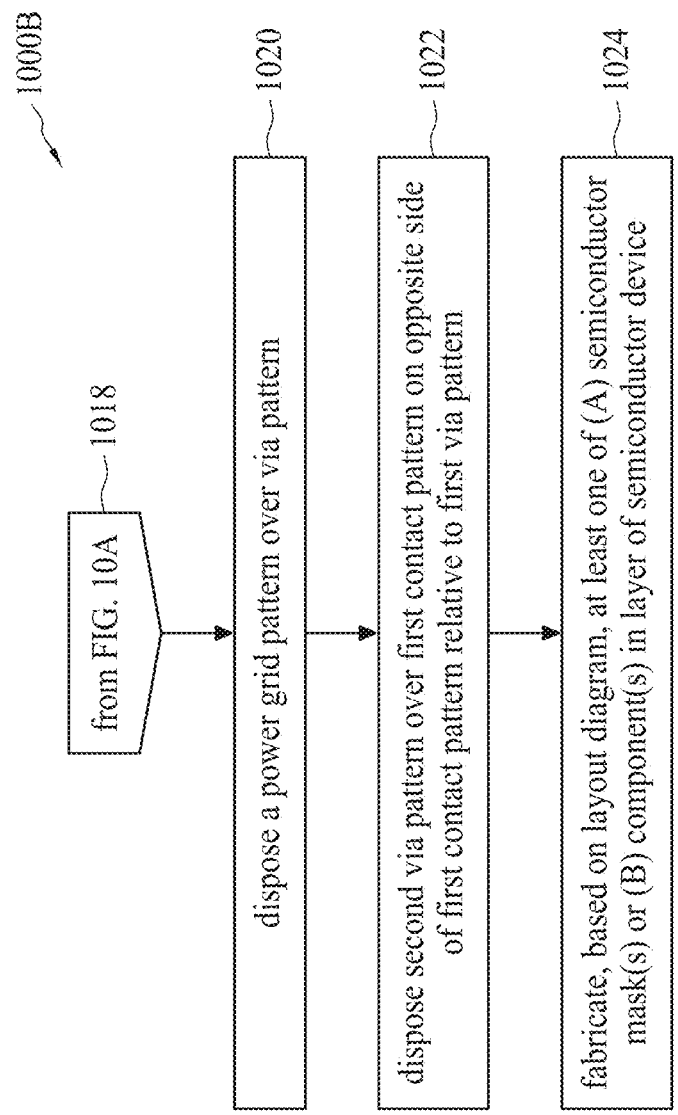

FIGS. 10A-10B are flowcharts of corresponding methods 1000A-1000B of generating a layout diagram, in accordance with one or more embodiments.

Examples of layout diagrams which can be generated according to methods 1000A-100B include the layout diagrams disclosed herein, or the like. In some embodiments, the layout diagram and versions thereof are stored on a non-transitory computer-readable medium, e.g., memory 1104 in FIG. 11 (discussed below). Methods 1000A-100B are implementable, for example, using EDA system 1100 (FIG. 11, discussed below), in accordance with some embodiments.

In FIG. 10A, method 1000A includes blocks 1002-1016. At block 1002, a first VEP adjacent region (VAR) is configured to be a first AA-continuous region. Examples of AA-continuous regions include AA-continuous regions 226(1) and 226(2) of FIG. 2A, AA-continuous regions 326(3)-326(5) of FIG. 3, or the like. From block 1002, flow proceeds to block 1004.

At block 1004, a second VAR is configured to be a first AA-discontinuous region. Examples of AA-discontinuous regions include AA-discontinuous regions 224(1) and 224(2) of FIG. 2A, AA-discontinuous region 324(3) of FIG. 3, or the like. From block 1004, flow proceeds to block 1006.

At block 1006, gate patterns are disposed correspondingly over first and second active area (AA) patterns. Examples of the AA patterns include AA patterns 206(1) and 206(2) of FIG. 2A, AA patterns 306(5) and 306(6) of FIG. 3, or the like. Examples of the gate patterns include gate patterns 208(1) and 208(2) of FIG. 2A, gate patterns 308(3)-308(5) of FIG. 3, or the like. From block 1006, flow proceeds to block 1008.

At block 1008, a long axis of a first one of the gate patterns is substantially aligned with an end of a corresponding AA pattern. Examples of the end of an AA pattern being aligned as such include end 232(2) of AA pattern 206(1) in FIG. 2A with which gate pattern 208(2) is substantially aligned, end 232(4) of AA pattern 206(2) in FIG. 2A with which gate pattern 208(2) is substantially aligned, end 332(8) of AA pattern 306(6) in FIG. 3 with which gate pattern 308(5) is substantially aligned, or the like. From block 1008, flow proceeds to block 1010.

At block 1010, first and second contact patterns are disposed over one of the first and second AA patterns. Examples of the first and second contact patterns being disposed as such include MD patterns 210(1) and 210(2) disposed over AA pattern 206(1), MD patterns 210(4) and 210(5) disposed over AA pattern 206(2), MD patterns 310(7) and 310(8) disposed over AA pattern 306(5), MD patterns 310(11) and 310(12) disposed over AA pattern 306(6), or the like. From block 1010, flow proceeds to block 1012.

At block 1012, a long axis of one of the first and second contact patterns is substantially aligned with a corresponding of the first and second VEPs. Examples of the first and second VEPs include VEPS 230(1) and 230(3) of FIG. 2A, VEPS 330(5) and 330(7) of FIG. 3, or the like. Examples of the contact patterns being aligned as such include MD pattern 210(1) substantially aligned with VEP 230(1), MD pattern 210(4) substantially aligned with VEP 230(3), MD pattern 310(7) substantially aligned with VEP 330(5), MD pattern 310(11) substantially aligned with VEP 330(7), or the like. From block 1012, flow proceeds to block 1014.

A long axis of the corresponding gate pattern is disposed, relative to the horizontal direction, away from the VEP towards a vertical midline of the first cell resulting in a gap in the horizontal direction between the gate pattern and the first contact pattern. Examples of the vertical midline include vertical midlines 234(1), 334(2), or the like. Examples of the gate pattern being displaced towards the interior of the cell away from the corresponding VEP include gate pattern 208(1) which is displaced inwardly of VEPs 230(1) and 230(3) relative to vertical midline 234(1), gate pattern 308(3) which is displaced inwardly of VEPs 330(5) and 330(7) relative to vertical midline 334(1), or the like.

At block 1014, a first via pattern is disposed over the first contact pattern. Examples of the first via pattern include via pattern 214(1), 214(5), 314(6), 314(11), or the like. From block 1014, flow proceeds to block 1016. Block 1016 is a connector to block 1018 of FIG. 10A. Flow proceeds from block 1016 to block 1018.

In FIG. 10B, method 1000B includes blocks 1018-1024. Block 1018 is a connector from block 1016 of FIG. 10A. From block 1018, flow proceeds to block 1020. At block 1020, a grid pattern is disposed over the via pattern. Examples of the power grid (PG) pattern include PG patterns 216(1) and 216(6), PG patterns 316(7) and 316(12), or the like. The first contact pattern, the first via pattern and the first gate pattern (208(1)) are included on a source side of an arrangement of patterns representing an active transistor. From block 1020, flow proceeds to block 1022.

At block 1022, a second via pattern is disposed over the second contact pattern. Examples of the second via pattern include via patterns 214(2) and 214(4), via pattern 314(2), or the like. The second contact pattern, the second via pattern and the first gate pattern are included on a drain side of an arrangement of patterns representing an active transistor. From block 1022, flow proceeds to block 1024.

At block 1024, based on the layout diagram, at least one of (A) one or more semiconductor masks or (B) at least one component in a layer of a semiconductor device is fabricated. See discussion below of FIG. 12. In some embodiments, the fabricating further includes performing one or more lithographic exposures based on the revised layout diagram.

Figure 11:
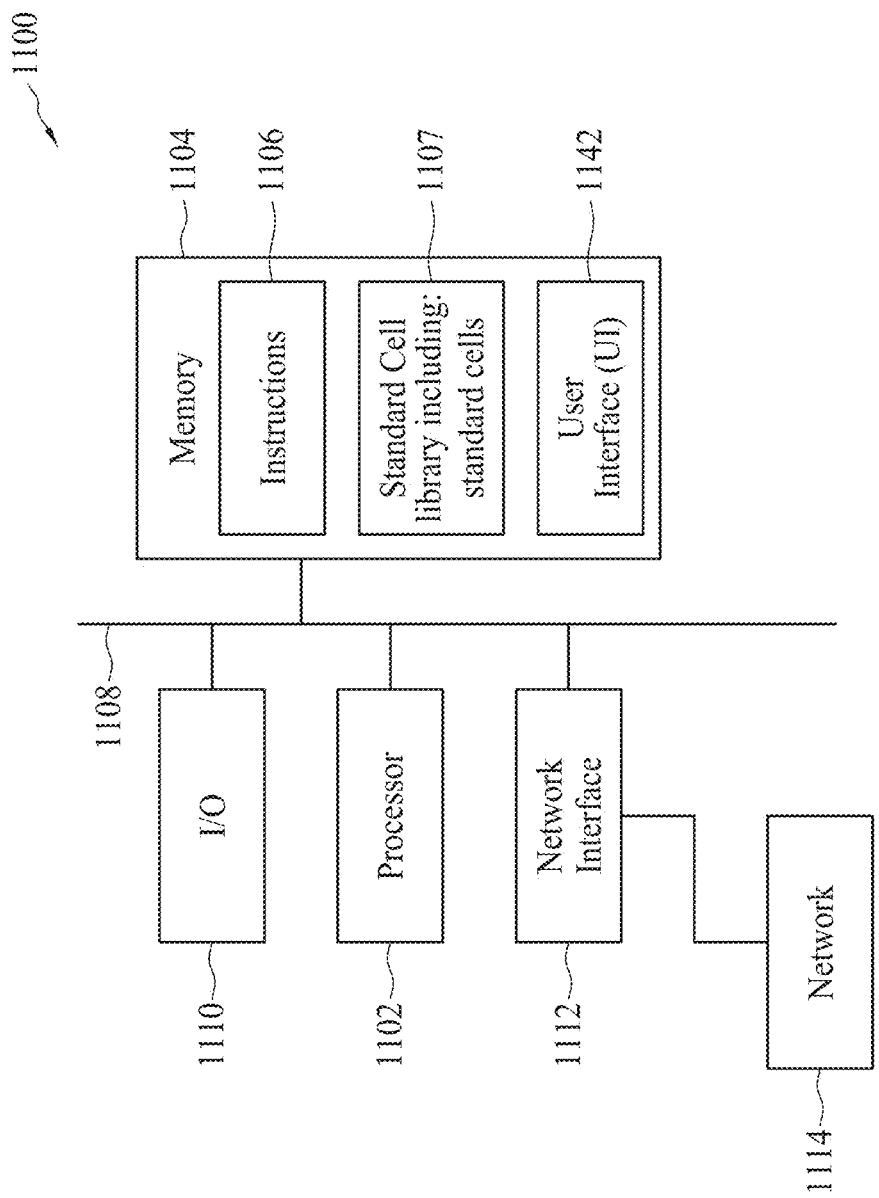
FIG. 11 is a block diagram of an electronic design automation (EDA) system, in accordance with some embodiments.

FIG. 11 is a block diagram of an electronic design automation (EDA) system 1100, in accordance with some embodiments.

In some embodiments, EDA system 1100 includes an APR system. Methods described herein of revising layout diagrams, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium (memory) 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to memory 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and memory 1104 are capable of connecting to external elements via network 1114. Processor 1102 is configured to execute instructions 1106 encoded in memory 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, memory 1104 is an electronic, magnetic, optical, electromagnetic, infrared, and/or a semiconductor system (or apparatus or device). For example, memory 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, memory 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein. In one or more embodiments, storage medium 1104 stores one or more layout diagrams 1109.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in memory 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
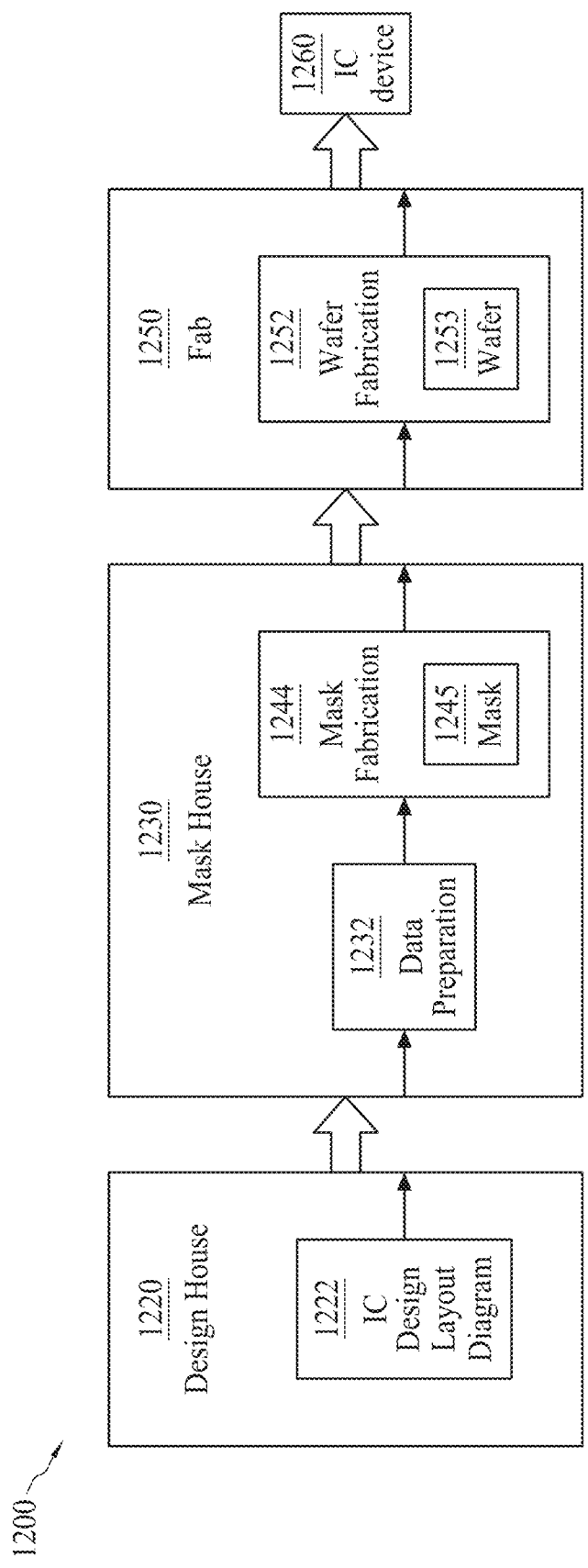
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 includes wafer fabrication 1252. IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an integrated circuit (IC) manufacturing system (e.g., system 1000 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

In an embodiment, a method (of manufacturing a semiconductor device) includes, for a layout diagram stored on a non-transitory computer-readable medium, generating a layout diagram including: for a first cell which includes first and second active area patterns, a cell-boundary (CB) having first and second edge portions (VEPs) substantially parallel to a vertical direction, and first and second VEP-adjacent regions correspondingly adjacent to the first and second VEPs: configuring the first VEP-adjacent region (VAR) to be a first active area (AA) continuous (AA-continuous) region in which the first active area pattern extends in a horizontal direction from an interior of the first cell to the first VEP; and configuring the second VAR to be a first AA-discontinuous region, the second active area pattern extending in the horizontal direction from the interior of the first cell towards the second VEP, and there being a first gap between a first end of the second active area pattern and the second VEP representing the first AA-discontinuous region. In an embodiment, the first VEP represents a segment of a first side of the first cell; and the second VEP represents a segment of a second side of the first cell opposite the first side. In an embodiment, the first and second VEPs represent corresponding segments of a same side of the first cell. In an embodiment, the first active area pattern extends continuously substantially from a horizontal midline of the first cell to the first VEP; and the second active area pattern extends continuously substantially from the horizontal midline to the first gap. In an embodiment, the generating a layout diagram further includes: for the first cell: disposing gate patterns, which extend in a vertical direction, correspondingly over the first and second active area patterns; and aligning a long axis of a first one of the gate patterns with the end of the second active area pattern. In an embodiment, the generating a layout diagram further includes: for the first cell: disposing first and second contact patterns, which extend in the vertical direction, correspondingly over one of the first and second active area patterns; and aligning long axes of one of the first and second contact patterns with a corresponding one of the first and second VEPs. In an embodiment, the generating a layout diagram further includes: for the first cell: disposing a via pattern over the first contact pattern; disposing a power grid pattern over the via pattern; and wherein a long axis of a first one of the gate patterns is disposed, relative to the horizontal direction, away from the first VEP towards a vertical midline of the first cell resulting in a gap in the horizontal direction between the second gate pattern and the first contact pattern, and the first contact pattern the via pattern and the first gate pattern are included on a source side of an arrangement of patterns representing an active transistor. In an embodiment, the generating a layout diagram further includes: for the first cell: disposing a second via pattern over the second contact pattern on an opposite side of the first gate pattern relative to the first via pattern; and aligning the second contact pattern with a long axis of the second active area pattern; and sizing the via pattern in the horizontal direction to overlap the first contact pattern the first gate pattern; and wherein the second contact pattern, the second via pattern and the first gate pattern are included on a drain side of an arrangement of patterns representing an active transistor. In an embodiment, the method further includes: fabricating, based on the layout diagram, at least one of (A) one or more semiconductor masks or (B) at least one component in a layer of a semiconductor integrated circuit.

In an embodiment, a semiconductor device includes: first and second active areas included in a first cell region; one of the first active area or the second active area extending in a horizontal direction from an interior of the first cell region into an abutting second cell region; and a first end of one of the first active area or the second active area extending in the horizontal direction from the interior of the first cell region towards an abutting third cell region, there being a first gap in the horizontal direction between the first end and a corresponding end of a corresponding active area in the third cell region. In an embodiment, the one of the first active area and the second active area which extends in the horizontal direction from an interior of the first cell region into the second cell region is the first active area; and the first end is an end of the second active area. In an embodiment, a same one of the first active area and the second active area is: the one of the first active area or the second active area which extends in the horizontal direction from the interior of the first cell region into the abutting second cell region; and the one of the first active area or the second active area for which the first end thereof extends in the horizontal direction from the interior of the first cell region towards the first gap and towards the abutting third cell region. In an embodiment, the first cell region further includes gate conductors which extend in a vertical direction; the gate conductors correspondingly being disposed over the first and second active areas; a long axis of a first one of the gate conductors being substantially aligned with the end of the second active area; and first and second contacts which extend in the vertical direction; and the first and second contacts extending into the second cell region and or the third cell region. In an embodiment, the first cell region further includes a via disposed over the first contact, and a power grid (PG conductor) disposed over the via; a long axis of a second one of the gate conductors is displaced in the horizontal direction away from the second cell region towards a horizontal midline of the first cell region resulting in a gap in the horizontal direction between the second gate conductor and the first contact; and the first contact and the second gate conductor are included in an arrangement of conductors representing an active transistor.

In an embodiment, a system (for generating a layout diagram, the layout diagram being stored on a non-transitory computer-readable medium) includes: at least one processor and at least one memory including computer program code for one or more programs, and wherein the at least one memory, the computer program code and the at least one processor are configured to cause the system to execute: generating a first cell which includes: first and second active area patterns; a cell-boundary (CB) having first to fourth edge portions (EPs) substantially parallel to a vertical direction (VEPs), the first and second VEPs corresponding to the first active area, and the third and fourth VEPs corresponding to the second active area; and first to fourth VEP-adjacent regions correspondingly adjacent the first to fourth VEPs; configuring the VARs correspondingly as an active area (AA) continuous (AA)-continuous region or as an AA-discontinuous region; configuring at least one of the VARs as an AA-continuous region; and configuring at least one of the VARs as an AA-discontinuous region. In an embodiment, the at least one memory, the computer program code and the at least one processor are further configured to cause the system to execute: configuring each of at least two but fewer than all of the VARs as AA-continuous regions or as AA-discontinuous regions; and configuring correspondingly at least one but less than or equal to two of the VARs as AA-discontinuous regions or AA-continuous regions. In an embodiment, the at least one memory, the computer program code and the at least one processor are further configured to cause the system to execute: configuring three of the VARs as AA-continuous regions or as AA-discontinuous regions; and configuring correspondingly one of the VARs as an AA-discontinuous region or an AA-continuous region. In an embodiment, the at least one memory, the computer program code and the at least one processor are further configured to cause the system to execute: for each AA-continuous region, extending the corresponding active area pattern in a horizontal direction from an interior of the first cell region to the corresponding VEP; and for each AA-discontinuous region, extending the corresponding active area in the horizontal direction from the interior of the first cell region towards the corresponding VEP, there being a gap between an end of the corresponding active area and the corresponding VEP representing the corresponding AA-discontinuous region. In an embodiment, the system further includes at least one of: a masking facility configured to fabricate one or more semiconductor masks based on the layout diagram; or a fabricating facility configured to fabricate at least one component in a layer of a semiconductor integrated circuit based on the layout diagram. In an embodiment, the masking facility is further configured, as an aspect included in fabrication of the one or more semiconductor masks, to perform one or more lithographic exposures based on the layout diagram; or the fabricating facility is further configured, as an aspect included in fabrication of the at least one component in a layer of the semiconductor integrated circuit, to perform one or more lithographic exposures based on the layout diagram.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
for a layout diagram stored on a non-transitory computer-readable medium, generating the layout diagram including:
for a first cell which includes first and second active area patterns, a cell-boundary (CB) having first and second edge portions (VEPs) substantially parallel to a vertical direction, and first and second VEP-adjacent regions correspondingly adjacent to the first and second VEPs:
configuring the first VEP-adjacent region (VAR) to be a first active area (AA) continuous (AA-continuous) region in which the first active area pattern extends in a horizontal direction from an interior of the first cell to the first VEP and the second VEP; and
configuring the second VAR to be a first AA-discontinuous region, the second active area pattern extending in the horizontal direction from the interior of the first cell towards the second VEP, and there being a first gap between a first end of the second active area pattern and the second VEP representing the first AA-discontinuous region.

2. The method of claim 1, wherein:
the first VEP represents a segment of a first side of the first cell; and
the second VEP represents a segment of a second side of the first cell opposite the first side.

3. The method of claim 1, wherein:
the first and second VEPs represent corresponding segments of a same side of the first cell.

4. The method of claim 1, wherein:
the first active area pattern extends continuously substantially from a horizontal midline of the first cell to the first VEP and the second VEP; and
the second active area pattern extends continuously substantially from the horizontal midline to the first gap.

5. The method of claim 1, wherein the generating the layout diagram further includes:
for the first cell:
disposing gate patterns, which extend in the vertical direction, correspondingly over the first and second active area patterns; and
aligning a long axis of a first one of the gate patterns with the first end of the second active area pattern.

6. The method of claim 5, wherein the generating the layout diagram further includes:
for the first cell:
disposing first and second contact patterns, which extend in the vertical direction, correspondingly over one of the first and second active area patterns; and
aligning long axes of one of the first and second contact patterns with a corresponding one of the first and second VEPs.

7. The method of claim 6, wherein the generating the layout diagram further includes:
for the first cell:
disposing a first via pattern over the first contact pattern;
disposing a power grid pattern over the first via pattern; and
wherein:
the long axis of the first one of the gate patterns is disposed, relative to the horizontal direction, away from the first VEP towards a vertical midline of the first cell resulting in a gap in the horizontal direction between a second gate pattern and the first contact pattern; and
the first contact pattern, the first via pattern, and the first gate pattern are included on a source side of an arrangement of patterns representing an active transistor.

8. The method of claim 7, wherein the generating the layout diagram further includes:
for the first cell:
disposing a second via pattern over the second contact pattern on an opposite side of the first gate pattern relative to the first via pattern; and
aligning the second contact pattern with a long axis of the second active area pattern; and
sizing the first via pattern in the horizontal direction to overlap the first contact pattern and the first gate pattern; and
wherein the second contact pattern, the second via pattern and the first gate pattern are included on a drain side of the arrangement of patterns representing the active transistor.

9. The method of claim 1, further comprising:
fabricating, based on the layout diagram, at least one of (A) one or more semiconductor masks or (B) at least one component in a layer of a semiconductor integrated circuit.

10. A semiconductor device comprising:
first and second active areas included in a first cell region;
one of the first active area or the second active area extending in a horizontal direction from an interior of the first cell region into an abutting second cell region and an abutting third cell region; and
a first end of one of the first active area or the second active area extending in the horizontal direction from the interior of the first cell region towards the abutting third cell region, there being a first gap in the horizontal direction between the first end and a corresponding end of a corresponding active area in the third cell region.

11. The semiconductor device of claim 10, wherein:
the one of the first active area and the second active area which extends in the horizontal direction from the interior of the first cell region into the second cell region is the first active area; and
the first end is an end of the second active area.

12. The semiconductor device of claim 10, wherein:
a same one of the first active area and the second active area is:
the one of the first active area or the second active area which extends in the horizontal direction from the interior of the first cell region into the abutting second cell region and the abutting third cell region; and
the one of the first active area or the second active area for which the first end thereof extends in the horizontal direction from the interior of the first cell region towards the first gap and towards the abutting third cell region.

13. The semiconductor device of claim 10, wherein the first cell region further includes:
gate conductors which extend in a vertical direction;
the gate conductors correspondingly being disposed over the first and second active areas;
a long axis of a first one of the gate conductors being substantially aligned with an first end of the second active area; and
first and second contacts which extend in the vertical direction; and
the first and second contacts extending into the second cell region and or the third cell region.

14. The semiconductor device of claim 13, wherein:
the first cell region further includes:
a via disposed over the first contact; and
a power grid (PG conductor) disposed over the via;
a long axis of a second one of the gate conductors is displaced in the horizontal direction away from the second cell region towards a horizontal midline of the first cell region resulting in a gap in the horizontal direction between the second gate conductor and the first contact; and
the first contact and the second gate conductor are included in an arrangement of conductors representing an active transistor.

15. A system for at least generating a layout diagram, the layout diagram being stored on a non-transitory computer-readable medium, the system comprising:
at least one processor; and
at least one memory including computer program code for one or more programs; and
wherein the at least one memory, the computer program code and the at least one processor are configured to cause the system to execute:
generating a first cell which includes:
first and second active area patterns;
a cell-boundary (CB) having first to fourth edge portions (VEPs) substantially parallel to a vertical direction, the first and second VEPs corresponding to the first active area, and the third and fourth VEPs corresponding to the second active area; and
first to fourth VEP-adjacent regions (VARs) correspondingly adjacent the first to fourth VEPs;
configuring the VARs correspondingly as an active area (AA) continuous region or as an AA-discontinuous region;
configuring at least two of the VARs as an AA-continuous region in which the first active area pattern extends in a horizontal direction from an interior of the first cell to the first VEP and the second VEP; and
configuring at least one of the VARs as the AA-discontinuous region, in which the second active area pattern extends in the horizontal direction from the interior of the first cell towards the fourth VEP, and there being a first gap between a first end of the second active area pattern and the fourth VEP.

16. The system of claim 15, wherein the at least one memory, the computer program code and the at least one processor are further configured to cause the system to execute:
configuring each of at least two but fewer than all of the VARs as AA-continuous regions or as AA-discontinuous regions; and configuring correspondingly at least one but less than or equal to two of the VARs as the AA-discontinuous regions or the AA-continuous regions.

17. The system of claim 16, wherein the at least one memory, the computer program code and the at least one processor are further configured to cause the system to execute:

configuring three of the VARs as the AA-continuous regions or as the AA-discontinuous regions; and configuring correspondingly one of the VARs as the AA-discontinuous region or the AA-continuous region.

18. The system of claim 15, further comprising at least one of:

a masking facility configured to fabricate one or more semiconductor masks based on based on the layout diagram; or a fabricating facility configured to fabricate at least one component in a layer of a semiconductor integrated circuit based on the layout diagram.

19. The system of claim 18, wherein:

the masking facility is further configured, as an aspect included in fabrication of the one or more semiconductor masks, to perform one or more lithographic exposures based on the layout diagram; or the fabricating facility is further configured, as an aspect included in fabrication of the at least one component in the layer of the semiconductor integrated circuit, to perform the one or more lithographic exposures based on the layout diagram.

20. The system of claim 15, wherein:

the first and second VEPs and the third and fourth VEPs represent corresponding segments of a same side of the first cell.

* * * * *